(12) United States Patent
Takamine

(10) Patent No.: US 10,541,674 B2
(45) Date of Patent: *Jan. 21, 2020

(54) MULTIPLEXER, TRANSMISSION DEVICE, RECEPTION DEVICE, HIGH-FREQUENCY FRONT END CIRCUIT, COMMUNICATION DEVICE AND IMPEDANCE MATCHING METHOD FOR MULTIPLEXER

(71) Applicant: Murata Manufacturing Co., Ltd., Nagaokakyo-shi, Kyoto-fu (JP)

(72) Inventor: Yuichi Takamine, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/221,772

(22) Filed: Dec. 17, 2018

(65) Prior Publication Data

US 2019/0140619 A1 May 9, 2019

Related U.S. Application Data

(63) Continuation of application No. 15/846,383, filed on Dec. 19, 2017, now Pat. No. 10,193,530, which is a (Continued)

(30) Foreign Application Priority Data

Jun. 24, 2015 (JP) .................................. 2015-127039

(51) Int. Cl.
*H04B 1/10* (2006.01)
*H03H 9/72* (2006.01)
(Continued)

(52) U.S. Cl.
CPC ................ *H03H 9/72* (2013.01); *H03H 7/38* (2013.01); *H03H 9/0009* (2013.01);
(Continued)

(58) Field of Classification Search
None
See application file for complete search history.

(56) References Cited

U.S. PATENT DOCUMENTS 8,867,572 B1 * 10/2014 Zhan ..................... H04W 16/26
370/497
2004/0119562 A1 * 6/2004 Sakano ................. H01P 1/2135
333/133

(Continued)

OTHER PUBLICATIONS

Takamine, "Multiplexer, Transmission Device, Reception Device, High-Frequency Front End Circuit, Communication Device and Impedance Matching Method for Multiplexer", U.S. Appl. No. 15/846,383, filed Dec. 19, 2017.

*Primary Examiner* — Kodzovi Acolatse
(74) *Attorney, Agent, or Firm* — Keating & Bennett, LLP

(57) ABSTRACT

A multiplexer includes elastic wave filters with different pass bands, a common terminal to which an inductance element is serially connected in a connection path between an antenna element and the common terminal; and an inductance element. Among the elastic wave filters, a reception input terminal of a first reception filter is connected to the common terminal via the inductance element and is connected to a parallel resonator. Transmission output terminals of transmission filters and a reception input terminal of a second reception filter are connected to the common terminal, are connected to series resonators, and are not connected to parallel resonators.

15 Claims, 24 Drawing Sheets

Related U.S. Application Data continuation of application No. PCT/JP2016/068656, filed on Jun. 23, 2016.

(51) Int. Cl.
  *H03H 7/38*  (2006.01)
  *H03H 9/145*  (2006.01)
  *H03H 9/64*  (2006.01)
  *H04B 1/04*  (2006.01)
  *H04B 1/18*  (2006.01)
  *H04B 1/52*  (2015.01)
  *H03H 9/02*  (2006.01)
  *H04B 1/00*  (2006.01)
  *H03H 9/00*  (2006.01)

(52) U.S. Cl.
  CPC .... *H03H 9/02535* (2013.01); *H03H 9/02574* (2013.01); *H03H 9/145* (2013.01); *H03H 9/64* (2013.01); *H03H 9/6436* (2013.01); *H03H 9/6483* (2013.01); *H03H 9/725* (2013.01); *H04B 1/0057* (2013.01); *H04B 1/04* (2013.01); *H04B 1/10* (2013.01); *H04B 1/18* (2013.01); *H04B 1/52* (2013.01)

(56) References Cited

U.S. PATENT DOCUMENTS

| | | | | |
|---|---|---|---|---|
| 2011/0316648 | A1* | 12/2011 | Fujita | H03H 9/0222 333/133 |
| 2012/0280768 | A1* | 11/2012 | Nakayama | H03H 9/0057 333/193 |
| 2012/0306595 | A1* | 12/2012 | Omote | H03H 9/6433 333/195 |
| 2013/0285768 | A1* | 10/2013 | Watanabe | H03H 9/0222 333/193 |
| 2014/0167877 | A1* | 6/2014 | Shimizu | H03H 7/38 333/101 |
| 2014/0218129 | A1* | 8/2014 | Fujiwara | H03H 9/6483 333/133 |
| 2016/0182119 | A1* | 6/2016 | Handtmann | H04B 1/48 375/220 |

* cited by examiner

Band4Tx

Band4Rx

MULTIPLEXER, TRANSMISSION DEVICE, RECEPTION DEVICE, HIGH-FREQUENCY FRONT END CIRCUIT, COMMUNICATION DEVICE AND IMPEDANCE MATCHING METHOD FOR MULTIPLEXER

CROSS REFERENCE TO RELATED APPLICATIONS

This application claims the benefit of priority to Japanese Patent Application No. 2015-127039 filed on Jun. 24, 2015 and is a Continuation Application of PCT Application No. PCT/JP2016/068656 filed on Jun. 23, 2016. The entire contents of each application are hereby incorporated herein by reference.

BACKGROUND OF THE INVENTION

1. Field of the Invention

The present invention relates to a multiplexer that includes an elastic wave filter, and to a transmission device, a reception device, a high-frequency front end circuit, a communication device, and an impedance matching method for a multiplexer.

2. Description of the Related Art

In recent years, there has been a demand for cellular phones to support a plurality of frequency bands and a plurality of wireless systems as a single terminal, that is, to support multiple bands and multiple modes as a single terminal. In order to satisfy this demand, a multiplexer that demultiplexes high-frequency signals having a plurality of radio carrier frequencies is arranged directly under a single antenna. Elastic wave filters, which are characterized by having low loss inside the pass band thereof and a steep pass band characteristic around the periphery of the pass band, are used as a plurality of band pass filters that define such a multiplexer.

Japanese Unexamined Patent Application Publication No. 2003-347898 discloses a surface acoustic wave device (SAW duplexer) having a configuration in which a plurality of surface acoustic wave filters are connected to each other. Specifically, an inductance element is connected between a connection node between a reception surface acoustic wave filter, a transmission surface acoustic wave filter and an antenna terminal, and a reference terminal (connected in parallel with connection node) in order to provide impedance matching between an antenna element and the antenna terminal. The complex impedance that is seen when a surface acoustic wave filter is viewed from the antenna terminal, to which a plurality of surface acoustic wave filters having capacitive properties are connected, can be made to be close to a characteristic impedance by utilizing such a parallel-connected impedance element. It is considered that degradation of insertion loss can be prevented in this manner.

However, in the impedance matching method of the related art in which an inductance element is connected in parallel with an antenna terminal, it is difficult to make the complex impedances of all of the elastic wave filters as seen from the antenna terminal match the characteristic impedance, and it is assumed that the insertion loss will increase.

Particularly in the recent case in which multiple bands and multiple modes are supported, the number of elastic wave filters connected to the antenna terminal is increased as in the case of a triplexer and a quadplexer. As the number of elastic wave filters increases, the capacitive property of a complex impedance seen from the antenna terminal becomes higher, and the size of the shift of the complex impedance from the characteristic impedance becomes larger. In the case in which an inductance element is connected in parallel with the antenna terminal, impedance matching is obtained in a smaller range of inductance values of the inductance element as the size of this shift becomes larger. However, as the inductance value of the parallel-connected inductance element becomes smaller, a signal from an elastic wave filter will leak out towards a reference terminal via the inductance element.

In other words, as the number of frequency bands that are to be demultiplexed is increased, that is, as the number of elastic wave filters connected to the antenna terminal is increased, there is a problem in that the insertion loss of the elastic wave filters is degraded in a configuration in which an inductance element is connected in parallel with the antenna terminal.

SUMMARY OF THE INVENTION

Preferred embodiments of the present invention provide multiplexers having reduced insertion loss inside a pass band of each filter, and also provide transmission devices, reception devices, high-frequency front end circuits, communication device, and impedance matching methods for a multiplexer.

A multiplexer according to a preferred embodiment of the present invention is a multiplexer that transmits and receives a plurality of high-frequency signals via an antenna element. The multiplexer includes a plurality of elastic wave filters that have different pass bands from each other; a common terminal to which a first inductance element is serially connected in a connection path between the antenna element and the common terminal; and a second inductance element. The plurality of elastic wave filters each include at least one of a series resonator that is connected between an input terminal and an output terminal of the elastic wave filter and a parallel resonator that is connected between a connection path, which connects the input terminal and the output terminal, and a reference terminal. An antenna-element-side terminal among the input terminal and the output terminal of one elastic wave filter among the plurality of elastic wave filters is connected to the common terminal via the second inductance element, which is connected to that antenna-element-side terminal and the common terminal, and is connected to the parallel resonator. Antenna-element-side terminals among the input terminals and the output terminals of the elastic wave filters other than the one elastic wave filter are connected to the common terminal, and are each connected to the series resonator of the series resonator and the parallel resonator.

With this configuration, the insertion loss inside the pass band of each filter of the multiplexer is able to be reduced even though the number of supported bands and modes is increased.

In addition, a complex impedance in a prescribed pass band when the one elastic wave filter is viewed in a standalone state via the second inductance element in a state in which the second inductance element and a terminal among the input terminal and the output terminal of the one elastic wave filter that is closer to the antenna element are connected in series with each other, and a complex impedance in the prescribed pass band when the elastic wave filters other than the one elastic wave filter are viewed from the terminals thereof that are connected to the common terminal in a state in which terminals among the input terminals and the output terminals of the elastic wave filters other than the one elastic wave filter that are closer to the antenna element are connected to the common terminal may be in a complex conjugate relationship with each other.

With this configuration, the complex impedance seen from the common terminal of the multiplexer that includes a circuit defined by combining a circuit in which the second inductance element and the one elastic wave filter are connected in series with each other and a circuit in which the elastic wave filters other than the one elastic wave filter are connected in parallel with each other at the common terminal is able to be made to match a characteristic impedance while securing low loss inside the pass bands. Furthermore, the complex impedance of the multiplexer as seen from the common terminal is able to be finely adjusted towards the inductive side by serially connecting the first inductance element having a small inductance value between the common terminal and the antenna element.

In addition, the series resonator and the parallel resonator may each include an IDT electrode, a piezoelectric layer including the IDT electrode provided on one surface thereof, a high-acoustic-velocity support substrate in which an acoustic velocity of a bulk wave that propagates therethrough is higher than an acoustic velocity of an elastic wave that propagates through the piezoelectric layer, and a low-acoustic-velocity film that is located between the high-acoustic-velocity support substrate and the piezoelectric layer, and in which an acoustic velocity of a bulk wave that propagates therethrough is lower than an acoustic velocity of an elastic wave that propagates through the piezoelectric layer.

A circuit element such as an inductance element or a capacitance element is added in order to achieve impedance matching between a plurality of elastic wave filters such as in the case in which the second inductance element is serially connected to the common terminal side of the one elastic wave filter. In such a case, it would be assumed that the Q values of the resonators would be reduced equivalently. However, the Q value of each resonator is able to be maintained at a high value due to the multilayer structure of the piezoelectric substrate. Therefore, elastic wave filters are able to be provided that have low in-band loss.

In addition, as the plurality of elastic wave filters, the multiplexer may include a first elastic wave filter that has a first pass band and that outputs a transmission signal to the antenna element, a second elastic wave filter that has a second pass band that is adjacent to the first pass band, and that is input with a reception signal from the antenna element, a third elastic wave filter that has a third pass band that is at a lower frequency than the first pass band and the second pass band, and that outputs a transmission signal to the antenna element, and a fourth elastic wave filter that has a fourth pass band that is at a higher frequency than the first pass band and the second pass band, and that is input with a reception signal from the antenna element, and the one elastic wave filter, which has the second inductance element connected thereto, may be at least one of the second elastic wave filter and the fourth elastic wave filter.

In addition, the multiplexer may further include the first inductance element.

With this configuration, a low-loss antenna front end section is able to be provided by simply connecting an antenna element to the multiplexer, and therefore, circuit implementation is simplified.

In addition, a transmission device according to a preferred embodiment of the present invention is a transmission device that is input with a plurality of high-frequency signals having different carrier frequency bands from each other, subjects the plurality of high-frequency signals to filtering, and then wirelessly transmits the plurality of high-frequency signals from a common antenna element. The transmission device includes a plurality of transmission elastic wave filters that are input with the plurality of high-frequency signals from a transmission circuit and that allow only prescribed frequency bands to pass therethrough; and a common terminal to which a first inductance element is serially connected in a connection path between the antenna element and the common terminal. The plurality of transmission elastic wave filters each include at least one of a series resonator that is connected between an input terminal and an output terminal of the elastic wave filter and a parallel resonator that is connected between a connection path, which connects the input terminal and the output terminal, and a reference terminal. Among the plurality of transmission elastic wave filters, the output terminal of one transmission elastic wave filter is connected to the common terminal via a second inductance element, which is connected to the output terminal and the common terminal, and is connected to the parallel resonator, and the output terminal of each transmission elastic wave filter other than the one transmission elastic wave filter is connected to the common terminal, and is connected to the series resonator.

In addition, a reception device according to a preferred embodiment of the present invention is a reception device that is input via an antenna element with a plurality of high-frequency signals having different carrier frequency bands from each other, demultiplexes the plurality of high-frequency signals and then outputs the plurality of high-frequency signals to a reception circuit. The reception device includes a plurality of reception elastic wave filters that are input with the plurality of high-frequency signals from the antenna element and that allow only prescribed frequency bands to pass therethrough; and a common terminal to which a first inductance element is serially connected in a connection path between the antenna element and the common terminal. The plurality of reception elastic wave filters each include at least one of a series resonator that is connected between an input terminal and an output terminal of the elastic wave filter and a parallel resonator that is connected between an electrical path, which connects the input terminal and the output terminal, and a reference terminal. Among the plurality of reception elastic wave filters, the input terminal of one reception elastic wave filter is connected to the common terminal via a second inductance element, which is connected to the input terminal and the common terminal, and is connected to the parallel resonator, and the input terminal of each reception elastic wave filter other than the one reception elastic wave filter is connected to the common terminal, and is connected to the series resonator.

In addition, an impedance matching method for a multiplexer according to a preferred embodiment of the present invention is an impedance matching method for a multiplexer that transmits and receives a plurality of high-frequency signals via an antenna element. The method includes a step of adjusting a plurality of elastic wave filters having different pass bands from each other such that complex impedances in the pass bands of other elastic wave filters when looking at one elastic wave filter in a standalone state from among the plurality of elastic wave filters from an input terminal or an output terminal of the one elastic wave filter are in shorted states, and such that complex impedances in the pass bands of the other elastic wave filters when looking at the elastic wave filters other than the one elastic wave filter in a standalone state from the input terminals or output terminals of the elastic wave filters are in open states; a step of adjusting an inductance value of a filter-matching-use inductance element such that a complex impedance when looking at the one elastic wave filter from the filter-matching-use inductance element when the filter-matching-use inductance element is connected in series with the one elastic wave filter and a complex impedance when looking at the elastic wave filters other than the one elastic wave filter from the common terminal when the other elastic wave filters are connected in parallel with the common terminal are in a complex conjugate relationship with each other; and a step of adjusting an inductance value of an antenna-matching-use inductance element that is serially connected between the antenna element and the common terminal such that a complex impedance, seen from the common terminal, of a composite circuit in which the one elastic wave filter is connected to the common terminal via the filter-matching-use inductance element and the other elastic wave filters are connected in parallel with the common terminal matches a characteristic impedance. In the step of adjusting the plurality of elastic wave filters, among the plurality of elastic wave filters each including at least one of a series resonator that is connected between an input terminal and an output terminal of the elastic wave filter and a parallel resonator that is connected between an electrical path, which connects the input terminal and the output terminal of the elastic wave filter, and a reference terminal, the parallel resonator and series resonator are arranged such that the parallel resonator is connected to the filter-matching-use inductance element in the one elastic wave filter and the series resonator among the parallel resonator and the series resonator is connected to the common terminal in each of the other elastic wave filters.

With this configuration, a multiplexer is able to be provided that has low loss even though the number of supported bands and modes is increased.

In addition, a high-frequency front end circuit according to a preferred embodiment of the present invention includes a multiplexer according to a preferred embodiment of the present invention and an amplification circuit that is connected to the multiplexer.

With this configuration, a high-frequency front end circuit is able to be provided in which insertion loss inside the pass bands of the filters that define the signal paths of the respective bands is reduced even though the number of bands and modes supported by the high-frequency front end circuit is increased.

Furthermore, a communication device according to a preferred embodiment of the present invention includes an RF signal processing circuit that processes high-frequency signals transmitted and received by an antenna element; and a high-frequency front end circuit according to a preferred embodiment of the present invention that transmits the high-frequency signals between the antenna element and the RF signal processing circuit.

With this configuration, a communication device is able to be provided in which insertion loss inside the pass bands of the filters that define the signal paths of the respective bands is reduced even though the number of bands and modes supported by the communication device is increased.

With multiplexers, transmission devices, reception devices, high-frequency front end circuits, and communication devices according to various preferred embodiments of the present invention, insertion loss inside the pass bands of the filters that define the bands and modes is able to be reduced even though the number of supported bands and modes is increased.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
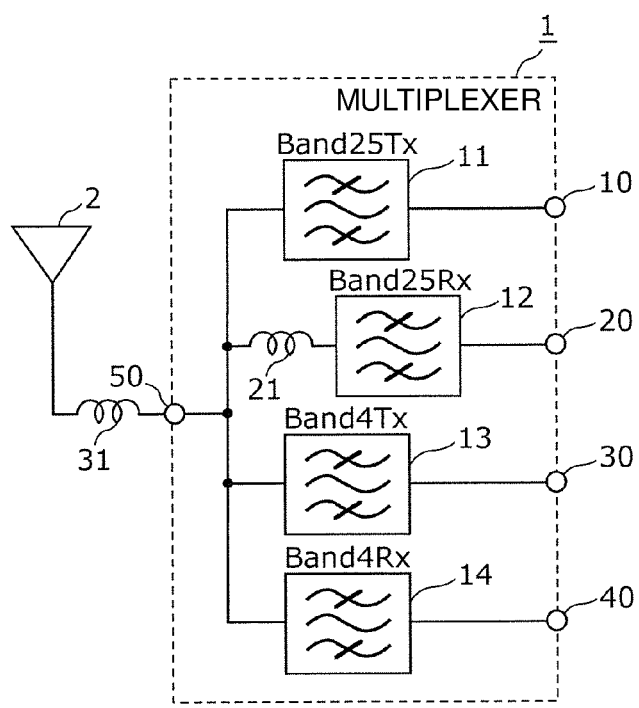
FIG. 1 is a circuit configuration diagram of a multiplexer according to an example of a preferred embodiment of the present invention.

Hereafter, preferred embodiments of the present invention will be described in detail by using examples and the drawings. The examples described hereafter each illustrate a comprehensive or specific example. The numerical values, shapes, materials, elements, arrangement positions of the elements, the ways in which the elements are connected and so forth provided in the following examples are merely examples and are not intended to limit the present invention. Elements not described in the independent claims of the present invention among elements in the following examples are described as arbitrary elements. In addition, the sizes of the element or the ratios between the sizes of the elements illustrated in the drawings are not necessarily strictly illustrated.

Example 1

In this example, a quadplexer will be exemplified that is preferably applied to Band 25 (transmission pass band: about 1850-1915 MHz, reception pass band: about 1930-1995 MHz) and Band 4 (transmission pass band: about 1710-1755 MHz, reception pass band: about 2110-2155 MHz) of the long term evolution (LTE) standard, for example.

A multiplexer 1 according to this example is a quadplexer in which a Band 25 duplexer and a Band 4 duplexer are connected to each other at a common terminal 50.

FIG. 1 is a circuit configuration diagram of the multiplexer 1 according to this example. As illustrated in FIG. 1, the multiplexer 1 includes transmission filters 11 and 13, reception filters 12 and 14, an inductance element 21 (second inductance element), the common terminal 50, transmission input terminals 10 and 30, and reception output terminals 20 and 40. In addition, the multiplexer 1 is connected to an antenna element 2 via an inductance element 31 (first inductance element) that is connected in series with the common terminal 50 and the antenna element 2.

The transmission filter 11 is preferably an unbalanced input-unbalanced output band pass filter (first elastic wave filter) that is input with a transmission wave generated by a transmission circuit (RFIC or the like) via the transmission input terminal 10, filters the transmission wave in the Band 25 transmission pass band (about 1850-1915 MHz: first pass band), and outputs the filtered transmission wave to the common terminal 50.

The reception filter 12 is preferably an unbalanced input-unbalanced output band pass filter (second elastic wave filter) that is input with a reception wave input from the common terminal 50, filters the reception wave in the Band 25 reception pass band (about 1930-1995 MHz: second pass band), and outputs the filtered reception wave to the reception output terminal 20. In addition, the inductance element 21 is connected in series between the reception filter 12 and the common terminal 50.

The transmission filter 13 is preferably an unbalanced input-unbalanced output band pass filter (third elastic wave filter) that is input with a transmission wave generated by a transmission circuit (RFIC or the like) via the transmission input terminal 30, filters the transmission wave in the Band 4 transmission pass band (about 1710-1755 MHz: third pass band), and outputs the filtered transmission wave to the common terminal 50.

The reception filter 14 is preferably an unbalanced input-unbalanced output band pass filter (fourth elastic wave filter) that is input with a reception wave input from the common terminal 50, filters the reception wave in the Band 4 reception pass band (about 2110-2155 MHz: fourth pass band), and outputs the filtered reception wave to the reception output terminal 40.

The transmission filters 11 and 13 and the reception filter 14 are connected in series with the common terminal 50.

Next, the structure of the surface acoustic wave resonators that define the transmission filters 11 and 13 and the reception filters 12 and 14 will be described.

Figure 2:
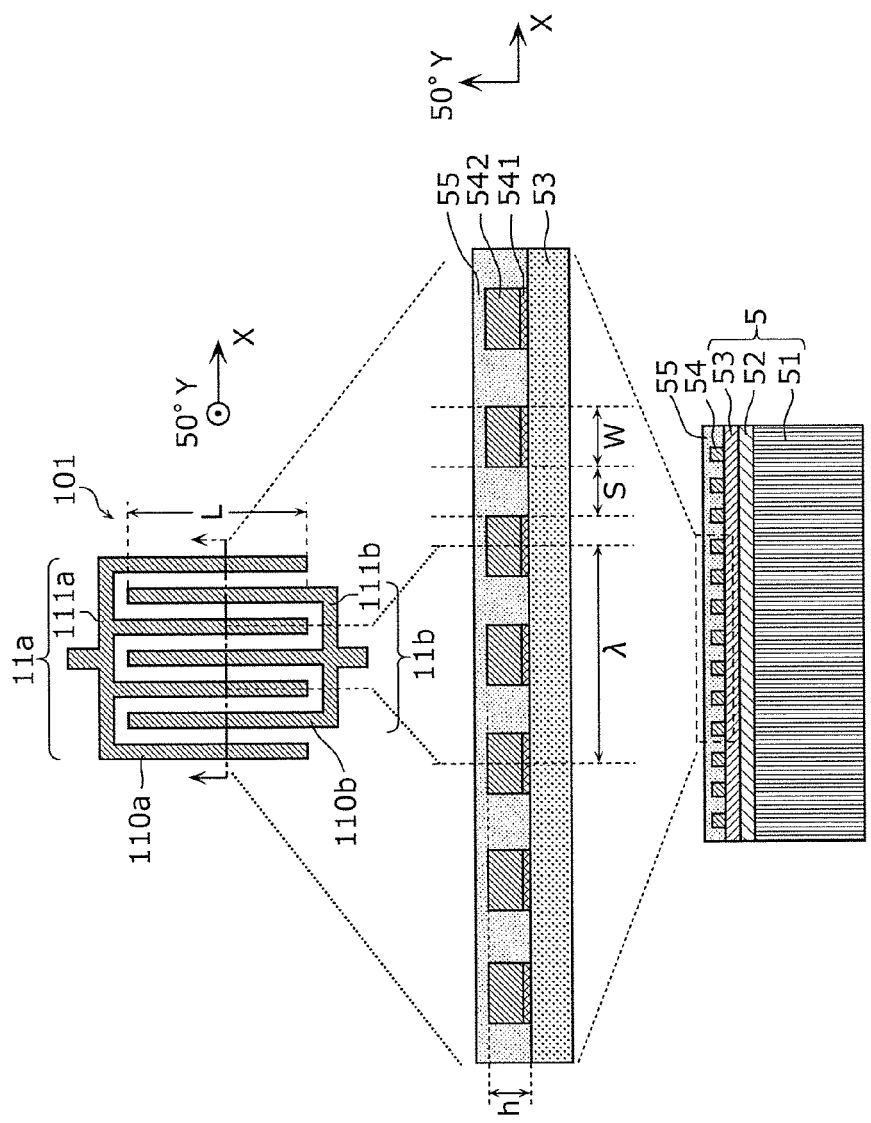
FIG. 2 illustrates a plan view and a sectional view that schematically illustrate a resonator of a surface acoustic wave filter according to the example.

FIG. 2 depicts a plan view and a sectional view that schematically illustrate a resonator of a surface acoustic wave filter according to the present example. In the figure, a plan schematic view and a sectional schematic view are exemplified that illustrate the structure of a series resonator of the transmission filter 11 from among the plurality of resonators that define the transmission filters 11 and 13 and the reception filters 12 and 14. The series resonator illustrated in FIG. 2 is shown to explain the typical structure of the plurality of resonators, and the number, length and other parameters of the electrode fingers defining the electrodes are not limited to those illustrated.

Each resonator of the transmission filters 11 and 13 and the reception filters 12 and 14 includes a substrate 5, which includes a piezoelectric layer 53, and interdigital transducer (IDT) electrodes 11a and 11b that have a comb shape.

As illustrated in the plan view of FIG. 2, the pair of IDT electrodes 11a and 11b, which face each other, are provided on the substrate 5. The IDT electrode 11a includes a plurality of electrode fingers 110a, which are parallel or substantially parallel to each other, and a busbar electrode 111a that connects the plurality of electrode fingers 110a to each other. In addition, the IDT electrode 11b includes a plurality of electrode fingers 110b, which are parallel or substantially parallel to each other, and a busbar electrode 111b that connects the plurality of electrode fingers 110b to each other. The plurality of electrode fingers 110a and the plurality of electrode fingers 110b extend in a direction perpendicular or substantially perpendicular to an X-axis direction.

Furthermore, an IDT electrode 54, which includes the plurality of electrode fingers 110a, the plurality of electrode fingers 110b, and the busbar electrodes 111a and 111b, preferably has a multilayer structure that includes an adhesive layer 541 and a main electrode layer 542, as illustrated in the sectional view of FIG. 2.

The adhesive layer 541 improves adhesion between the substrate 5 and the main electrode layer 542, and Ti is preferably used as the material of the adhesive layer 541, for example. The film thickness of the adhesive layer 541 is preferably about 12 nm, for example.

Al with a Cu content of about 1% is preferably used as the material of the main electrode layer 542, for example. The film thickness of the main electrode layer 542 is preferably about 162 nm, for example.

A protective layer 55 preferably covers the IDT electrodes 11a and 11b. The purpose of the protective layer 55 is to protect the main electrode layer 542 from the external environment, to adjust the frequency-temperature characteristics, to improve moisture resistance and so on. The protective layer 55 is preferably a film including silicon dioxide as a main component, for example.

The materials of the adhesive layer 541, the main electrode layer 542, and the protective layer 55 are not limited to the above-described materials. In addition, the IDT electrode 54 does not need to have a multilayer structure. The IDT electrode 54 may be made of a metal such as Ti, Al, Cu, Pt, Au, Ag or Pd, or an alloy of such a metal, or may include a plurality of multilayer bodies made of such a metal or alloy, for example. Furthermore, the protective layer 55 does not need to be provided.

Next, the multilayer structure of the substrate 5 will be described.

As illustrated in the lower portion of FIG. 2, the substrate 5 preferably includes a high-acoustic-velocity support substrate 51, a low-acoustic-velocity film 52, and a piezoelectric layer 53, and has a structure in which the high-acoustic-velocity support substrate 51, the low-acoustic-velocity film 52 and the piezoelectric layer 53 are stacked on top of one another in this order.

The piezoelectric layer 53 preferably includes a 50° Y-cut X-propagation LiTaO$_3$ piezoelectric single crystal or a piezoelectric ceramic (a lithium tantalate single crystal cut along a plane having a normal line obtained by rotating an axis by about 50° from a Y axis around an X axis, or a ceramic, and is a single crystal in which a surface acoustic wave propagates in an X axis direction or a ceramic), for example. The piezoelectric layer 53 preferably has a thickness of about 600 nm, for example. Piezoelectric layers 53 preferably including a 42-45° Y-cut X-propagation LiTaO$_3$ piezoelectric single crystal or a piezoelectric ceramic are used for the transmission filter 13 and the reception filter 14.

The high-acoustic-velocity support substrate 51 is a substrate that supports the low-acoustic-velocity film 52, the piezoelectric layer 53 and the IDT electrode 54. The high-acoustic-velocity support substrate 51 is a substrate in which the acoustic velocity of a bulk wave inside the high-acoustic-velocity support substrate 51 is higher than that of an elastic wave such as a surface wave or a boundary wave that propagates through the piezoelectric layer 53, and functions so as to confine a surface acoustic wave in the part where the piezoelectric layer 53 and the low-acoustic-velocity film 52 are stacked and so that the surface acoustic wave does not leak to below the high-acoustic-velocity support substrate 51. The high-acoustic-velocity support substrate 51 is preferably a silicon substrate, for example, and has a thickness of about 200 μm, for example.

The low-acoustic-velocity film 52 is a film in which the acoustic velocity of a bulk wave inside the low-acoustic-velocity film 52 is lower than the acoustic velocity of an elastic wave that propagates through the piezoelectric layer 53, and the low-acoustic-velocity film 52 is located between the piezoelectric layer 53 and the high-acoustic-velocity support substrate 51. Leakage of the energy of a surface acoustic wave to outside the IDT electrode is significantly reduced or prevented by this structure and the property that the energy of an elastic wave is substantially concentrated in a medium having a low acoustic velocity. The low-acoustic-velocity film 52 is preferably a film that has silicon dioxide as a main component, for example, and has a thickness of about 670 nm, for example.

The multilayer structure of the substrate 5 is able to significantly increase the Q value at the resonant frequency and anti-resonant frequency as compared to a structure of the related art in which a piezoelectric substrate is a single layer. In other words, a high Q value surface acoustic wave resonator is able to be obtained, and therefore, a filter is able to be provided that has small insertion loss by using the surface acoustic wave resonator.

Furthermore, a circuit element, such as an inductance element or a capacitance element, is added in order to achieve impedance matching between a plurality of surface acoustic wave filters such as in the case where the inductance element 21, which is used for impedance matching, is connected to the common terminal 50 side of the reception filter 12. Thus, it would be assumed that the Q values of the resonators would decrease equivalently. However, even in such a case, the Q values of the resonators is able to be maintained at high values due to the multilayer structure of the substrate 5. Therefore, a surface acoustic wave filter is able to be provided that has low in-band loss.

The high-acoustic-velocity support substrate 51 may have a structure in which a support substrate and a high-acoustic-velocity film, in which the acoustic velocity of a bulk wave propagating therethrough is higher than that of an elastic wave such as a surface acoustic wave or a boundary wave propagating through the piezoelectric layer 53, are stacked one on top of the other. In this case, for example, sapphire, a piezoelectric material such as lithium tantalate, lithium niobate or quartz, a dielectric such as any of various ceramics such as alumina, magnesia, silicon nitride, aluminum nitride, silicon carbide, zirconia, cordierite, mullite, steatite and forsterite, or glass, a semiconductor such as silicon or gallium nitride or a resin substrate may be used as the support substrate. In addition, any of various high-acoustic-velocity materials may be used for the high-acoustic-velocity film, such as aluminum nitride, aluminum oxide, silicon carbide, silicon nitride, silicon oxynitride, a DLC film or diamond, a substance including any of the above-described materials as a main component or a substance including a mixture of any of the above-described materials as a main component, for example.

Next, the design parameters of the IDT electrode will be described. The wavelength of the surface acoustic wave resonator is defined by a repeating pitch λ of the plurality of electrode fingers 110a and 110b, which define the IDT electrodes 11a and 11b illustrated in the central portion of FIG. 2. In addition, an intersection width L of the IDT electrode is the electrode finger length over which the electrode fingers 110a of the IDT electrode 11a and the electrode fingers 110b of the IDT electrode 11b overlap with each other when viewed from the X-axis direction as illustrated in the upper portion of FIG. 2. In addition, a duty ratio is a line width occupation ratio of the plurality of electrode fingers 110a and 110b and is the ratio of the line width to the sum of the line width and the spacing width of the plurality of electrode fingers 110a and 110b. More specifically, the duty ratio is defined by W/(W+S), where W is the line width of the electrode fingers 110a and 110b that constitute the IDT electrodes 11a and 11b, and S is the spacing width between an electrode finger 110 and an electrode finger 110b that are adjacent to each other.

Figure 3A:
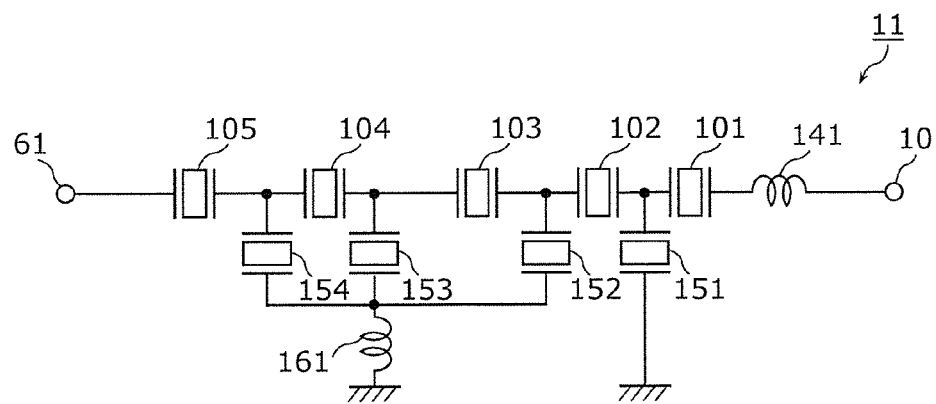
FIG. 3A is a circuit configuration diagram of a Band 25 transmission filter of the multiplexer according to the example.

FIG. 3A is a circuit configuration diagram of the Band 25 transmission filter 11 of the multiplexer 1 according to the present example. As illustrated in FIG. 3A, the transmission filter 11 includes series resonators 101 to 105, parallel resonators 151 to 154, and matching-use inductance elements 141 and 161.

The series resonators 101 to 105 are connected in series with each other between the transmission input terminal 10 and a transmission output terminal 61. In addition, the parallel resonators 151 to 154 are connected in parallel with each other between connection points between the transmission input terminal 10, the transmission output terminal 61 and the series resonators 101 to 105, and reference terminals (ground). As a result of the series resonators 101 to 105 and the parallel resonators 151 to 154 being connected to each other in this manner, the transmission filter 11 is a ladder-type band pass filter. In addition, the inductance element 141 is connected between the transmission input terminal 10 and the series resonator 101, and the inductance element 161 is connected between a connection point between the parallel resonators 152, 153 and 154, and a reference terminal.

The transmission output terminal 61 is connected to the common terminal 50. In addition, the transmission output terminal 61 is connected to the series resonator 105, and is not directly connected to any of the parallel resonators 151 to 154.

Figure 3B:
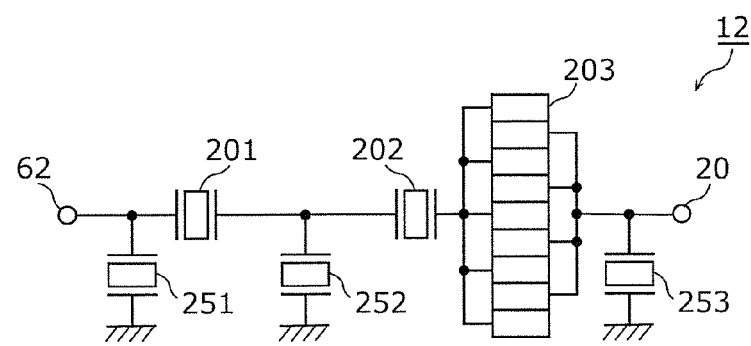
FIG. 3B is a circuit configuration diagram of a Band 25 reception filter of the multiplexer according to the example.
Figure 3C:
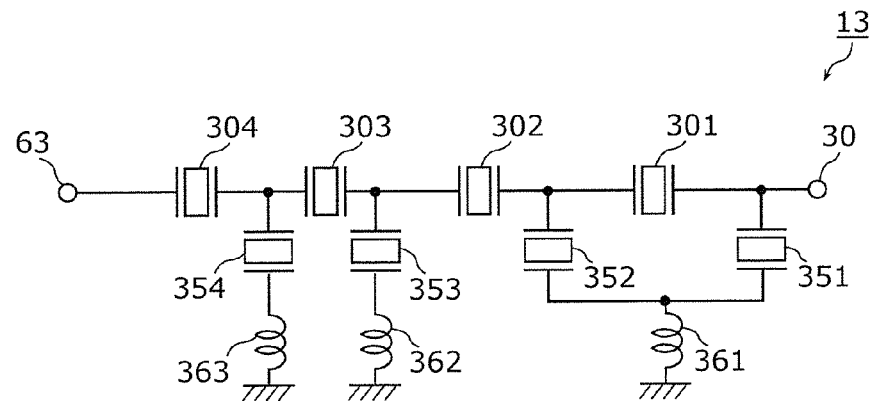
FIG. 3C is a circuit configuration diagram of a Band 4 transmission filter of the multiplexer according to the example.

FIG. 3C is a circuit configuration diagram of the Band 4 transmission filter 13 of the multiplexer 1 according to the present example. As illustrated in FIG. 3C, the transmission filter 13 includes series resonators 301 to 304, parallel resonators 351 to 354, and matching-use inductance elements 361 to 363.

The series resonators 301 to 304 are connected in series with each other between the transmission input terminal 30 and a transmission output terminal 63. In addition, the parallel resonators 351 to 354 are connected in parallel with each other between connection points between the transmission input terminal 30, the transmission output terminal 63 and the series resonators 301 to 304, and reference terminals (ground). As a result of the series resonators 301 to 304 and the parallel resonators 351 to 354 being connected to each other in this manner, the transmission filter 13 is a ladder-type band pass filter.

The transmission output terminal 63 is connected to the common terminal 50. In addition, the transmission output terminal 63 is connected to the series resonator 304, and is not directly connected to any of the parallel resonators 351 to 354.

FIG. 3B is a circuit configuration diagram of the Band 25 reception filter 12 of the multiplexer 1 according to the present example. As illustrated in FIG. 3B, the reception filter 12 includes a longitudinally coupled type surface acoustic wave filter section, for example. More specifically, the reception filter 12 includes a longitudinally coupled type filter section 203, series resonators 201 and 202, and parallel resonators 251 to 253.

Figure 4:
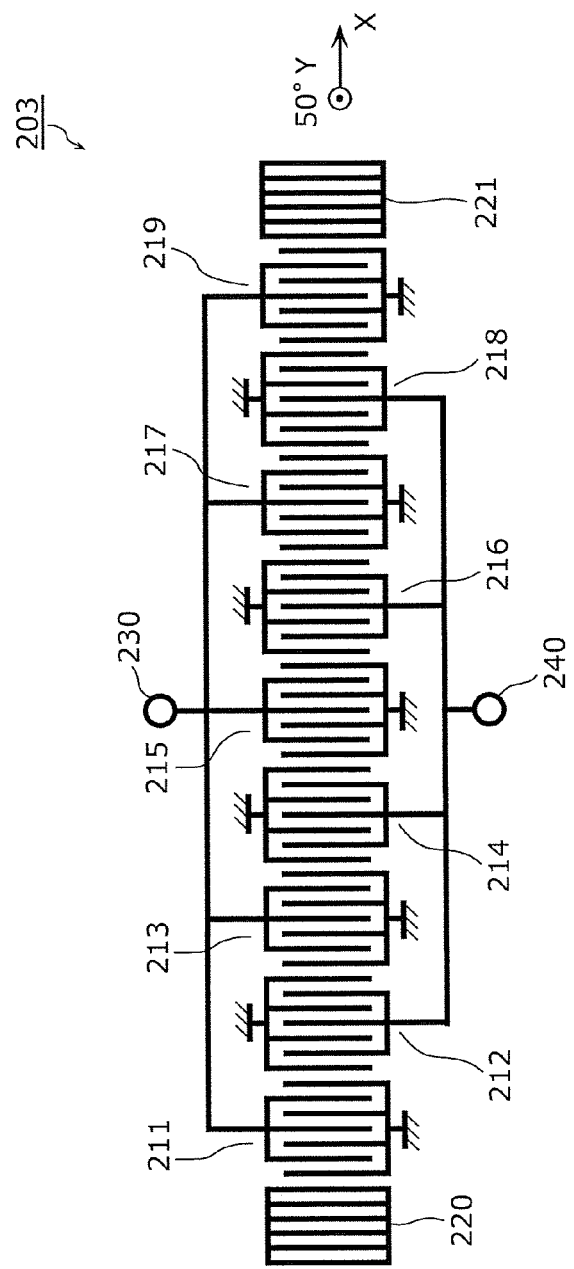
FIG. 4 is a schematic plan view illustrating the electrode configuration of a longitudinally coupled type surface acoustic wave filter according to the example.

FIG. 4 is a schematic plan view illustrating the electrode configuration of the longitudinally coupled type filter section 203 according to the present example. As illustrated in FIG. 4, the longitudinally coupled type filter section 203 includes IDTs 211 to 219, reflectors 220 and 221, an input port 230 and an output port 240.

The IDTs 211 to 219 each include a pair of IDT electrodes that face each other. The IDTs 214 and 216 are arranged so as to sandwich the IDT 215 therebetween in the X-axis direction, and the IDTs 213 and 217 are arranged so as to sandwich the IDTs 214 to 216 therebetween in the X-axis direction. Furthermore, the IDTs 212 and 218 are arranged so as to sandwich the IDTs 213 to 217 therebetween in the X-axis direction, and the IDTs 211 and 219 are arranged so as to sandwich the IDTs 212 to 218 therebetween in the X-axis direction. The reflectors 220 and 221 are arranged so as to sandwich the IDTs 211 to 219 therebetween in the X-axis direction. In addition, the IDTs 211, 213, 215, 217 and 219 are connected in parallel between the input port 230 and a reference terminal (ground), and the IDTs 212, 214, 216 and 218 are connected in parallel between the output port 240 and a reference terminal.

Furthermore, as illustrated in FIG. 3B, the series resonators 201 and 202 and the parallel resonators 251 and 252 define a ladder-type filter section.

A reception input terminal 62 is connected to the common terminal 50 via the inductance element 21. In addition, as illustrated in FIG. 3B, the reception input terminal 62 is connected to the parallel resonator 251.

Figure 3D:
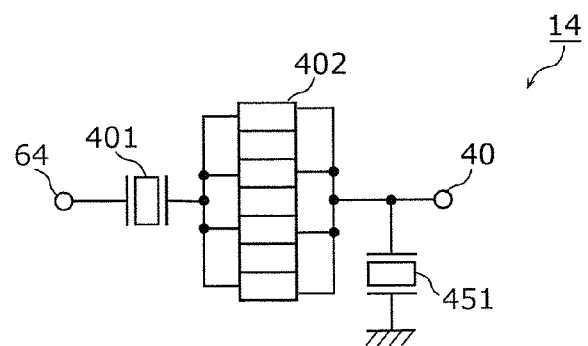
FIG. 3D is a circuit configuration diagram of a Band 4 reception filter of the multiplexer according to the example.

FIG. 3D is a circuit configuration diagram of the Band 4 reception filter 14 of the multiplexer 1 according to the present example. As illustrated in FIG. 3D, the reception filter 14 includes a longitudinally coupled type surface acoustic wave filter section, for example. More specifically, the reception filter 14 includes a longitudinally coupled type filter section 402, a series resonator 401 and a parallel resonator 451.

The electrode configuration of the longitudinally coupled type filter section 402 is the same or substantially the same as that of the longitudinally coupled type filter section 203 of the reception filter 12 except for the number of IDTs that are arranged, and therefore, description thereof is omitted.

A reception input terminal 64 is connected to the common terminal 50. In addition, as illustrated in FIG. 3D, the reception input terminal 64 is connected to the series resonator 401, and is not directly connected to the parallel resonator 451.

The arrangement configurations of the resonators and the circuit elements in the surface acoustic wave filters of the multiplexer 1 according to this preferred embodiment are not limited to the arrangement configurations exemplified by the transmission filters 11 and 13 and the reception filters 12 and 14 according to the above examples. The arrangement configurations of the resonators and the circuit elements in the surface acoustic wave filters will differ depending on the specifications required for the pass band characteristics in each of the frequency bands (Bands). The term "arrangement configuration", for example, refers to the numbers of series resonators and parallel resonators that are arranged, and to selection of filter configurations, such as ladder and longitudinally coupled filter configurations.

Unique characteristics of the arrangement configuration of the resonators and circuit elements of the elastic wave filters of the multiplexer 1 according to this preferred embodiment are that (1) the transmission filters 11 and 13 and the reception filters 12 and 14 each include at least one of a series resonator and a parallel resonator, (2) the reception input terminal 62 of the reception filter 12, which is one elastic wave filter, is connected to the common terminal 50 via the inductance element 21 and is connected to the parallel resonator 251, and (3) the transmission output terminals 61 and 63 of the transmission filters 11 and 13 and the reception input terminal 64 of the reception filter 14, which are elastic wave filters other than the reception filter 12, are connected to the common terminal 50 and are respectively connected to the series resonators 105, 304 and 401 among the series resonators and parallel resonators.

In other words, the multiplexer 1 according to a preferred embodiment of the present invention includes a plurality of surface acoustic wave filters having different pass bands from each other, the common terminal 50 to which the inductance element 31 is serially connected in a connection path between the antenna element 2 and the common terminal 50, and the inductance element 21. Here, the plurality of surface acoustic wave filters each include at least one of a series resonator that has an IDT electrode provided on the substrate 5 and is connected between an input terminal and an output terminal of the surface acoustic wave filter, and a parallel resonator that includes an IDT electrode provided on the substrate 5 and that is connected between an electrical path that connects the input terminal and the output terminal, and a reference terminal. In addition, the reception input terminal 62 of the reception filter 12 among the plurality of surface acoustic wave filters is connected to the common terminal 50 via the inductance element 21, and is connected to the parallel resonator 251. On the other hand, the transmission output terminals 61 and 63 of the transmission filters 11 and 13 and the reception input terminal 64 of the reception filter 14 are connected to the common terminal 50, are connected to the series resonators 105, 304 and 401, and are not connected to a parallel resonator.

According to the multiplexer 1 having the above-described characteristics, even though the number of supported bands and modes is increased, insertion loss inside the pass bands of the filters that provide these bands and modes is able to be reduced.

Next, the operational principles of a ladder-type surface acoustic wave filter according to the present example will be described.

For example, the parallel resonators 151 to 154 illustrated in FIG. 3A each have a resonant frequency frp and an anti-resonant frequency fap (>frp) in the resonance characteristics thereof. In addition, the series resonators 101 to 105 each have a resonant frequency frs and an anti-resonant frequency fas (>frs>frp) in the resonance characteristics thereof. The resonant frequencies frs of the series resonators 101 to 105 are preferably designed so as to match or substantially match each other, but do not necessarily match each other. In addition, the same is true of the anti-resonant frequencies fas of the series resonators 101 to 105, the resonant frequencies frp of the parallel resonators 151 to 154 and the anti-resonant frequencies fap of the parallel resonators 151 to 154, and the frequencies do not necessarily match each other.

When constructing a band pass filter using resonators in a ladder configuration, the anti-resonant frequencies fap of the parallel resonators 151 to 154 and the resonant frequencies frs of the series resonators 101 to 105 are made to be close to each other. As a result, a region in the vicinity of the resonant frequencies frp where the impedances of the parallel resonators 151 to 154 approach zero forms a low-frequency-side stop band. Furthermore, as the frequency increases from here, the impedances of the parallel resonators 151 to 154 become higher in the vicinity of the anti-resonant frequencies fap and the impedances of the series resonators 101 to 105 in the vicinity of the resonant frequencies frs approach zero. Thus, a signal pass band is provided in a signal path from the transmission input terminal 10 to the transmission output terminal 61 in the vicinity of the region from the anti-resonant frequencies fap to the resonant frequencies frs. In addition, as the frequency increases and approaches the vicinity of the anti-resonant frequencies fas, the impedance of the series resonators 101 to 105 increases and a high-frequency-side stop band is provided. In other words, the steepness of the attenuation characteristic in the high-frequency-side stop band is greatly affected by where the anti-resonant frequencies fas of the series resonators 101 to 105 are set outside the signal pass band.

When a high-frequency signal is input to the transmission filter 11 from the transmission input terminal 10, a potential difference is generated between the transmission input terminal 10 and the reference terminals, and as a result, a surface acoustic wave that propagates in the X direction is generated due to the substrate 5 undergoing deformation. Here, the pitch λ of the IDT electrodes 11a and 11b and the wavelength of the pass band are set to match or substantially match each other, and as a result, only a high-frequency signal having a frequency component that is desired to pass passes through the transmission filter 11.

Hereafter, the frequency characteristics and the impedance characteristics of the multiplexer 1 according to the present example will be described while comparing the characteristics to those of a multiplexer according to a comparative example.

Figure 5:
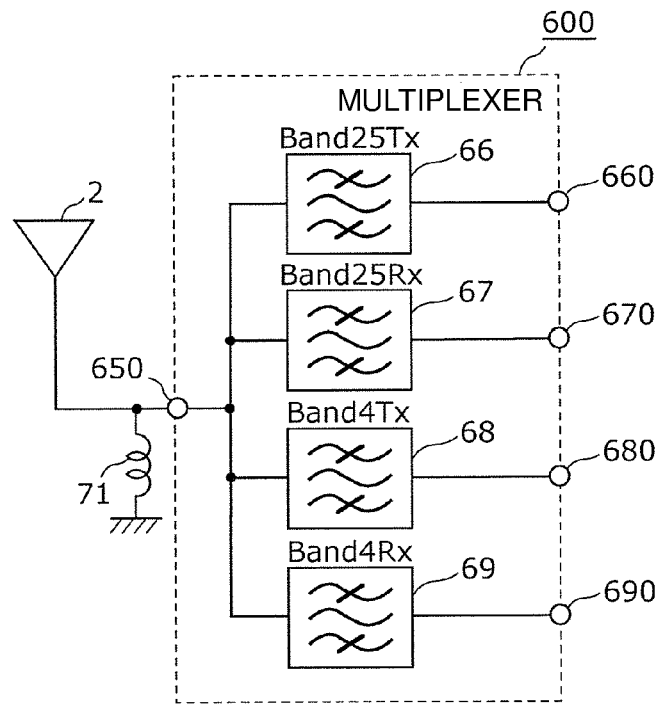
FIG. 5 is a circuit configuration diagram of a multiplexer according to a comparative example.
Figure 6A:
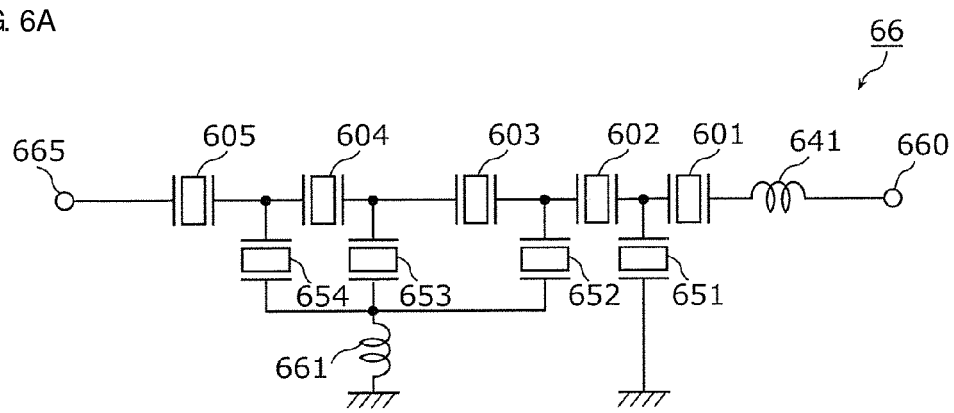
FIG. 6A is a circuit configuration diagram of a Band 25 transmission filter of the multiplexer according to the comparative example.
Figure 6B:
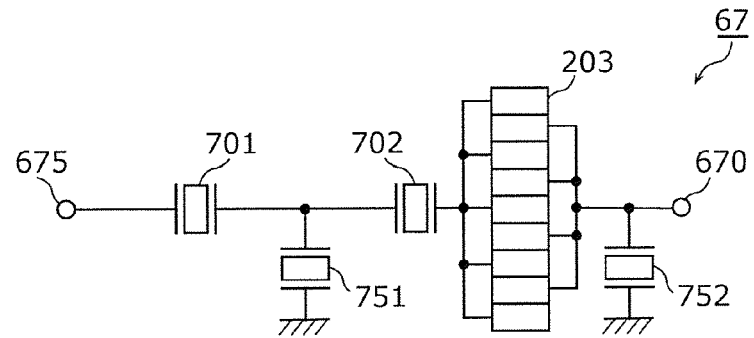
FIG. 6B is a circuit configuration diagram of a Band 25 reception filter of the multiplexer according to the comparative example.
Figure 6C:
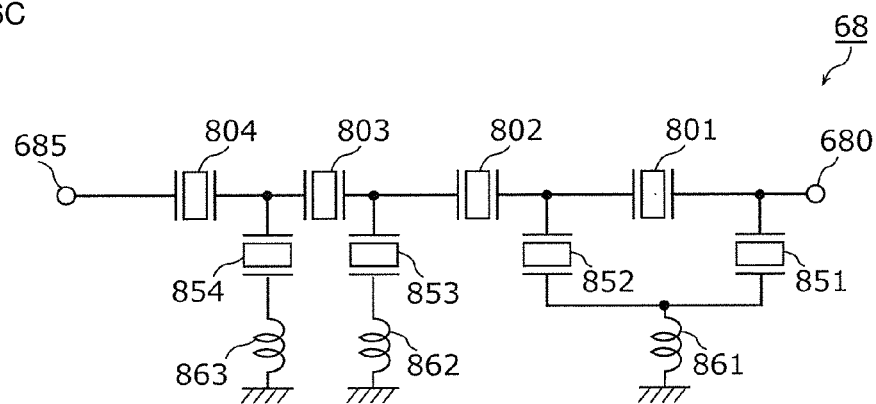
FIG. 6C is a circuit configuration diagram of a Band 4 transmission filter of the multiplexer according to the comparative example.
Figure 6D:
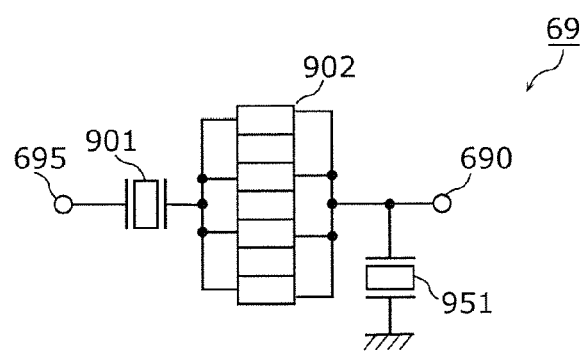
FIG. 6D is a circuit configuration diagram of a Band 4 reception filter of the multiplexer according to the comparative example.

FIG. 5 is a circuit configuration diagram of a multiplexer 600 according to a comparative example. In addition, FIG. 6A is a circuit configuration diagram of a Band 25 transmission filter 66 of the multiplexer 600 according to the comparative example. FIG. 6B is a circuit configuration diagram of a Band 25 reception filter 67 of the multiplexer 600 according to the comparative example. FIG. 6C is a circuit configuration diagram of a Band 4 transmission filter 68 of the multiplexer 600 according to the comparative example. FIG. 6D is a circuit configuration diagram of a Band 4 reception filter 69 of the multiplexer 600 according to the comparative example.

As illustrated in FIG. 5, the multiplexer 600 includes the transmission filters 66 and 68, the reception filters 67 and 69, a common terminal 650, transmission input terminals 660 and 680 and reception output terminals 670 and 690. In addition, an inductance element 71 is connected in parallel with a connection node between the common terminal 650 and an antenna element 2.

Hereafter, a specific configuration of the multiplexer 600 according to the comparative example will be described while focusing on points that are different from the multiplexer 1 according to the present example.

As illustrated in FIG. 6A, the transmission filter 66 has the same or substantially the same circuit configuration as the transmission filter 11. As illustrated in FIG. 6C, the transmission filter 68 has the same or substantially the same circuit configuration as the transmission filter 13. As illustrated in FIG. 6D, the reception filter 69 has the same or substantially the same circuit configuration as the reception filter 14.

As illustrated in FIG. 6B, the reception filter 67 differs from the reception filter 12 only in that a series resonator 701 is connected to a reception input terminal 675 and a parallel resonator is not connected to the reception input terminal 675.

As described above, the configuration of the multiplexer 600 according to the comparative example differs from that of the multiplexer 1 according to the present example in that (1) an inductance element is not serially connected between the reception filter 67 and the common terminal 650, (2) the inductance element 71 located between the common terminal 650 and the antenna element 2 is connected in parallel rather than being connected in series, and (3) the series resonator 701 is connected to the reception input terminal 675 of the reception filter 67 and a parallel resonator is not connected to the reception input terminal 675 of the reception filter 67.

Figure 7A:
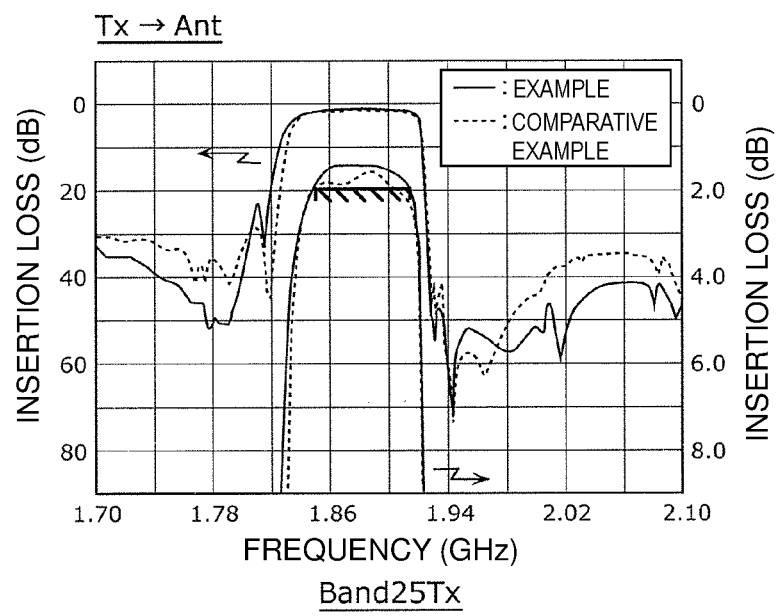
FIG. 7A illustrates a graph that compares the bandpass characteristics of the Band 25 transmission filters according to the example and the comparative example.
Figure 7B:
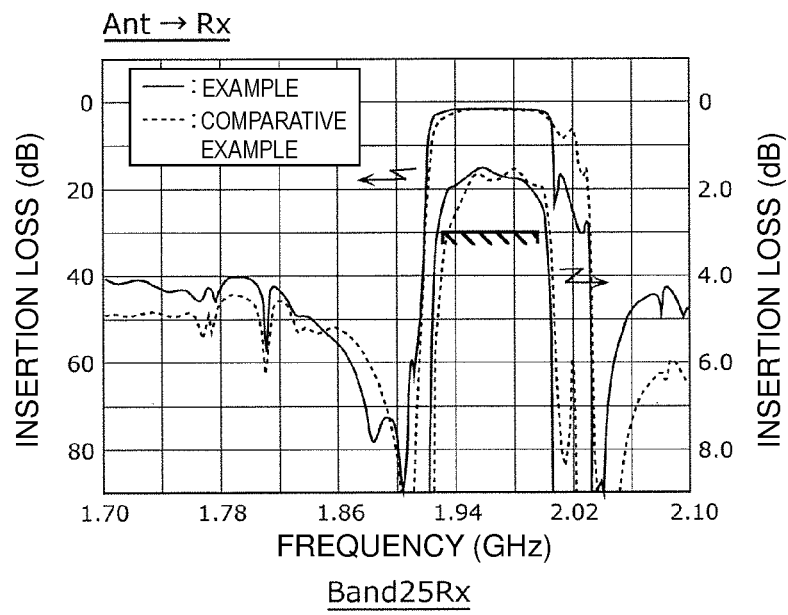
FIG. 7B illustrates a graph that compares the bandpass characteristics of the Band 25 reception filters according to the example and the comparative example.
Figure 7C:
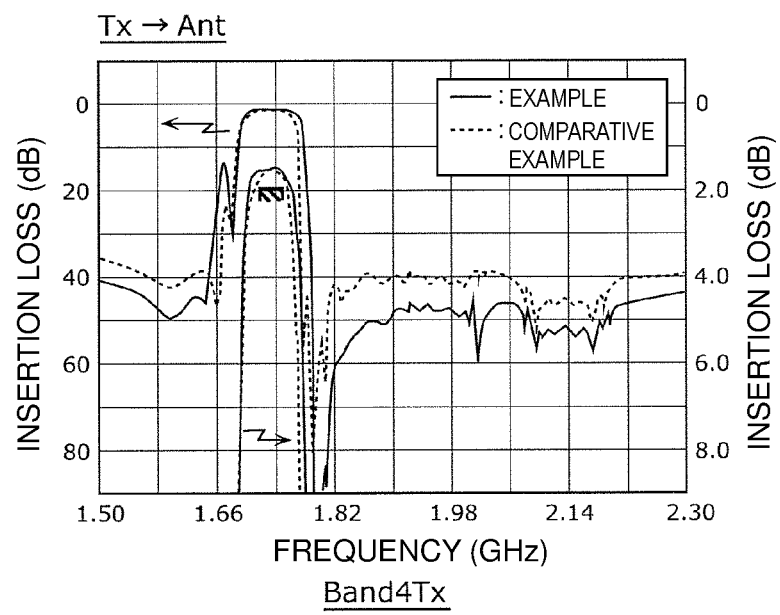
FIG. 7C illustrates a graph that compares the bandpass characteristics of the Band 4 transmission filters according to the example and the comparative example.
Figure 7D:
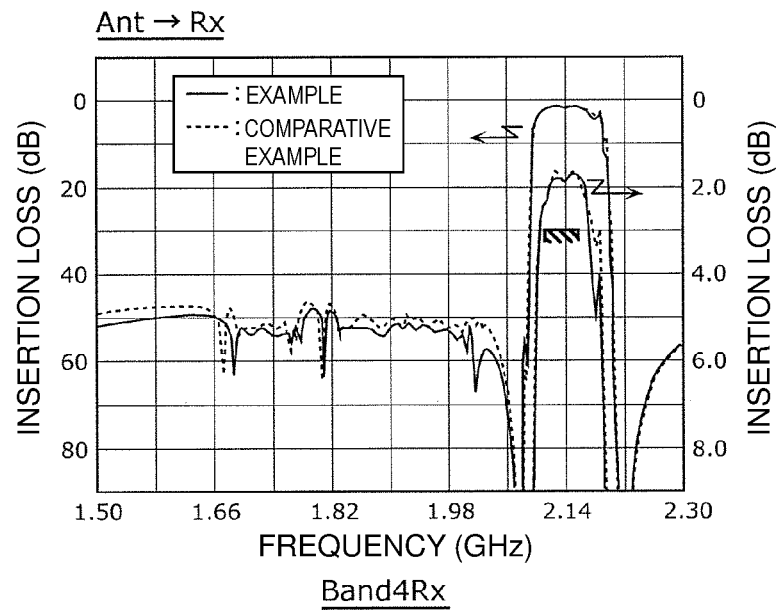
FIG. 7D illustrates a graph that compares the bandpass characteristics of the Band 4 reception filters according to the example and the comparative example.

FIG. 7A illustrates a graph that compares the bandpass characteristics of the Band 25 transmission filters 11 and 66 according to the present example and the comparative example. FIG. 7B illustrates a graph that compares the bandpass characteristics of the Band 25 reception filters 12 and 67 according to the present example and the comparative example. FIG. 7C illustrates a graph that compares the bandpass characteristics of the Band 4 transmission filters 13 and 68 according to the present example and the comparative example. FIG. 7D illustrates a graph that compares the bandpass characteristics of the Band 4 reception filters 14 and 69 according to the present example and the comparative example.

It is clear from FIGS. 7A to 7D that the insertion loss inside the pass band is better in the present example than in the comparative example for the Band 25 transmission and reception filters and the Band 4 transmission filter. Furthermore, it is clear that the specifications required inside the pass bands (transmission-side insertion loss of about 2.0 dB or less, and reception-side insertion loss of about 3.0 dB or less, for example) are satisfied in all of the frequency bands of the Band 25 transmission and reception pass bands and the Band 4 transmission and reception pass bands in the multiplexer 1 according to the present example.

In contrast, it is clear that the specifications required inside the Band 25 transmission and reception pass bands are not satisfied in the multiplexer 600 according to the comparative example.

As described above, with the multiplexer 1 according to this example, insertion loss inside the pass bands of filters that provide the bands and modes is able to be reduced even though the number of bands and modes supported by the multiplexer 1 is increased.

Hereafter, the reason that the multiplexer 1 according to the present example of a preferred embodiment of the present invention achieves low loss inside the pass bands will be described.

Figure 8A:
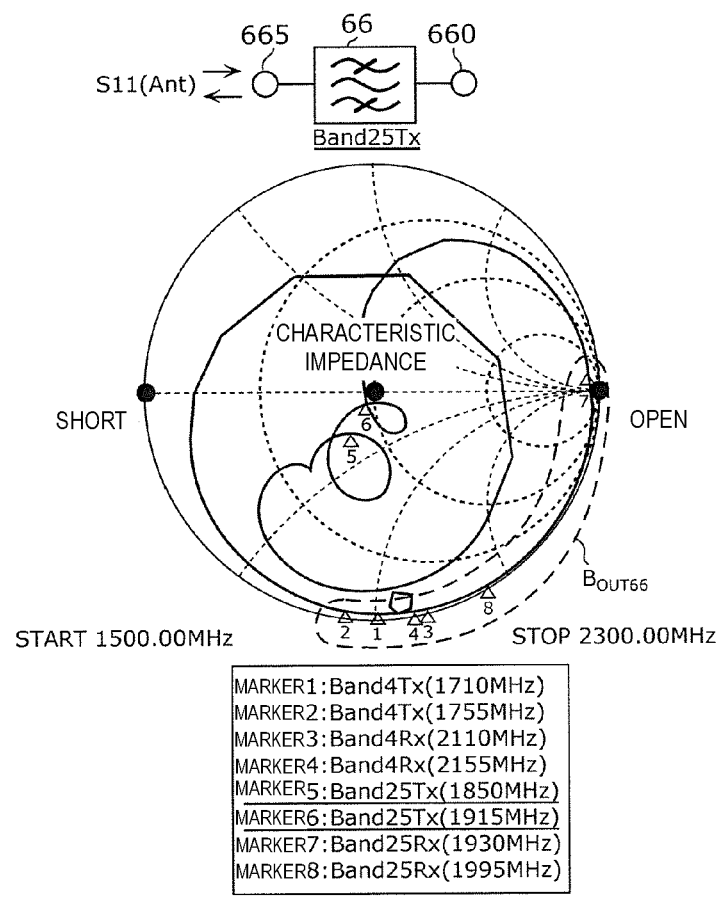
FIG. 8A depicts a Smith chart that illustrates the complex impedance of the Band 25 transmission filter according to the comparative example in a standalone state as seen a transmission output terminal.
Figure 8B:
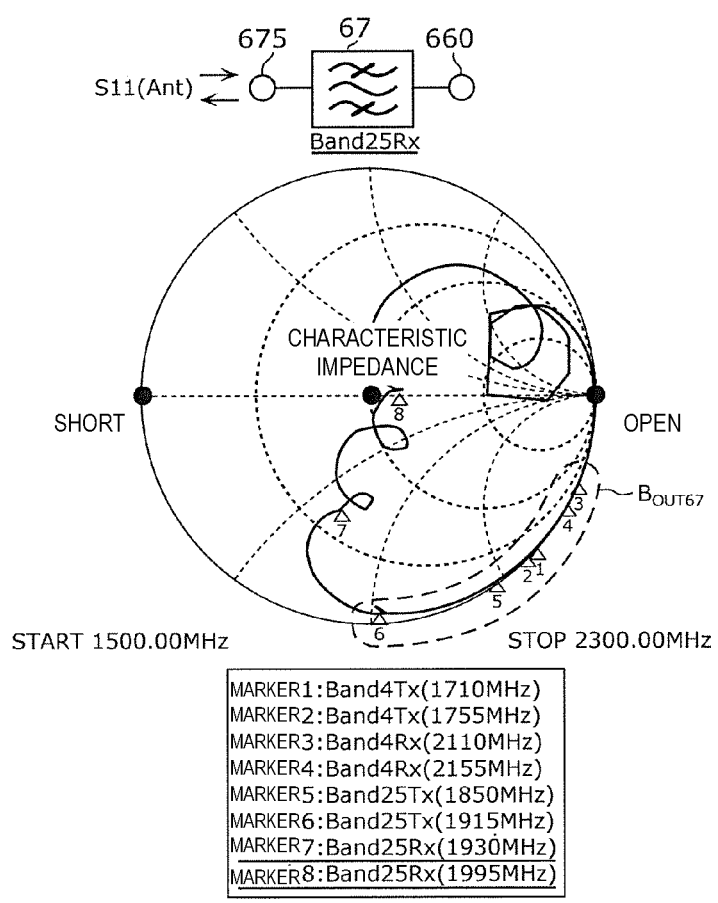
FIG. 8B depicts a Smith chart that illustrates the complex impedance of the Band 25 reception filter according to the comparative example in a standalone state as seen from a reception input terminal.
Figure 8C:
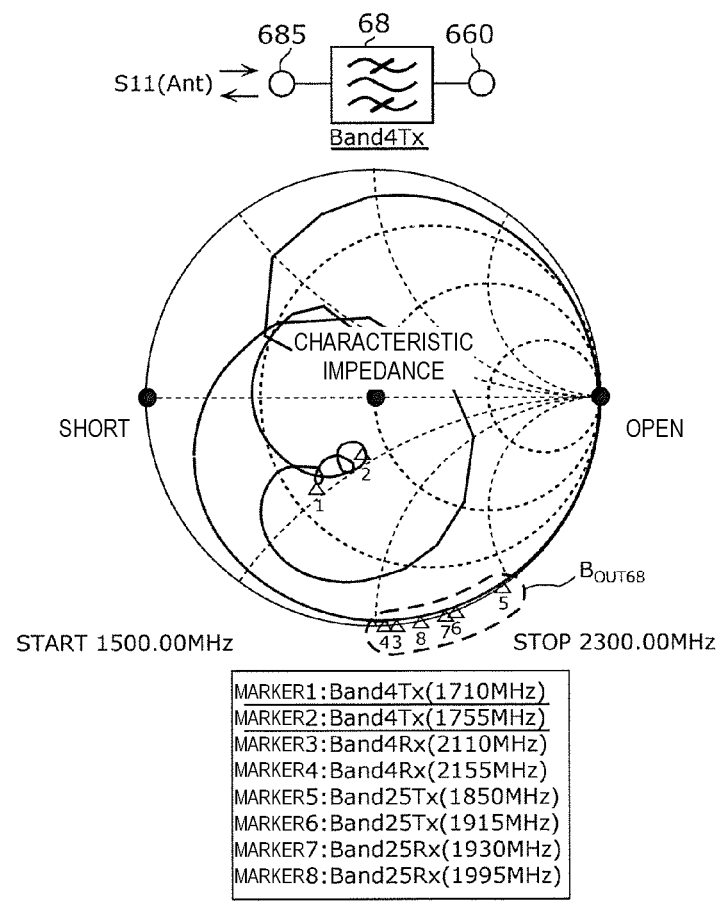
FIG. 8C depicts a Smith chart that illustrates the complex impedance of the Band 4 transmission filter according to the comparative example in a standalone state as seen a transmission output terminal.

FIGS. 8A and 8B respectively depict a Smith chart that illustrates the complex impedance of the Band 25 transmission filter 66 according to the comparative example in a standalone state as seen from the transmission output terminal 665, and a Smith chart that illustrates the complex impedance of the Band 25 reception filter 67 according to the comparative example in a standalone state as seen from the reception input terminal 675. In addition, FIGS. 8C and 8D respectively depict a Smith chart that illustrates the complex impedance of the Band 4 transmission filter 68 according to the comparative example in a standalone state as seen from the transmission output terminal 685, and a Smith chart that illustrates the complex impedance of the Band 4 reception filter 69 according to the comparative example in a standalone state as seen from the reception input terminal 695.

Figure 8D:
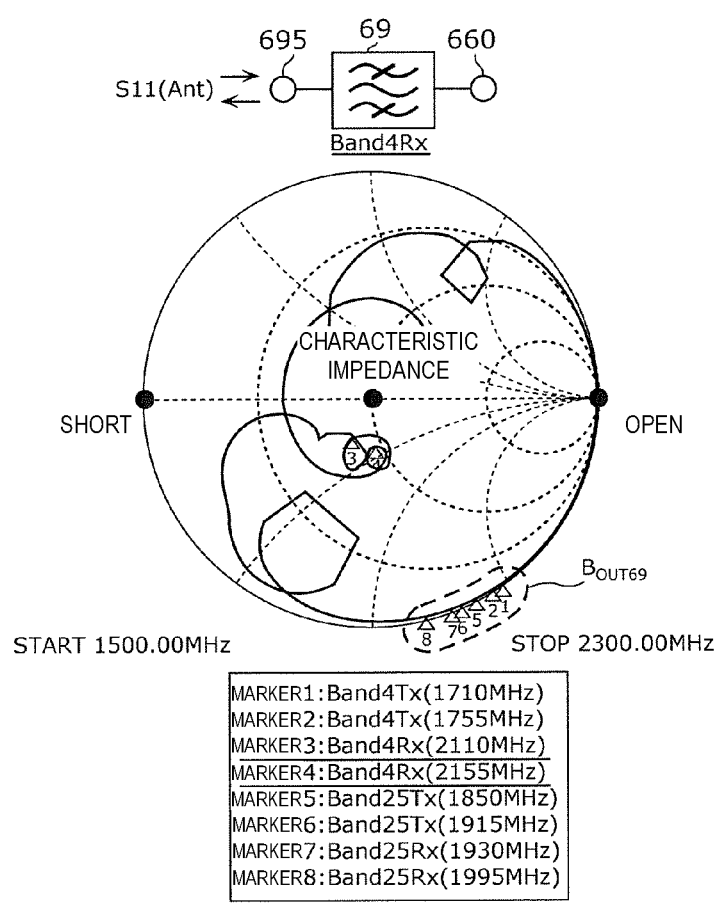
FIG. 8D depicts a Smith chart that illustrates the complex impedance of the Band 4 reception filter according to the comparative example in a standalone state as seen from a reception input terminal.

In the multiplexer 600 according to the comparative example, each filter is connected to the common terminal 650, and then final impedance matching is achieved by the parallel-connected inductance element 71. Therefore, the multiplexer is designed such that the complex impedances in the frequency regions outside the pass bands move towards the open side in the impedance characteristics of each of the filters in a standalone state. Specifically, the complex impedance of an outside-of-passband region $B_{OUT66}$ of the transmission filter 66 in FIG. 8A, the complex impedance of an outside-of-passband region $B_{OUT67}$ of the reception filter 67 in FIG. 8B, the complex impedance of an outside-of-passband region $B_{OUT68}$ of the transmission filter 68 in FIG. 8C, and the complex impedance of an outside-of-passband region $B_{OUT69}$ of the reception filter 69 in FIG. 8D are all arranged substantially on the open side. In order to achieve these arrangements of complex impedances, the resonators that are connected to the common terminal 650 in all of the filters are series resonators rather than parallel resonators.

Figure 9:
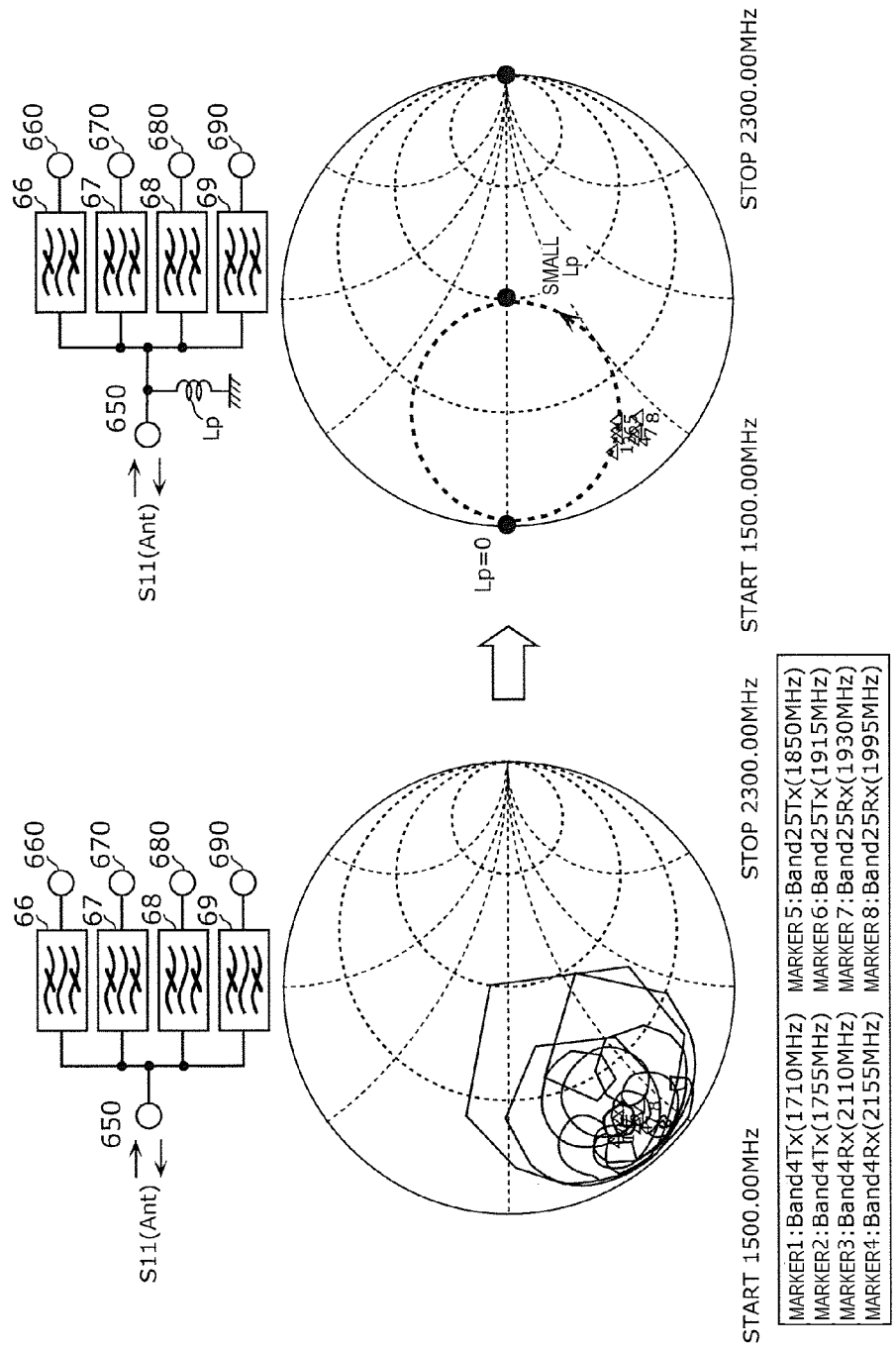
FIG. 9 depicts a Smith chart that illustrates the complex impedance of a circuit according to a comparative example in which four filters are connected in parallel with each other at a common terminal as seen from the common terminal, and a Smith chart for explaining movement of the complex impedance that occurs when an inductor element is connected in parallel with the common terminal.

FIG. 9 depicts a Smith chart (left side) that illustrates the complex impedance of a circuit according to the comparative example in which four filters are connected in parallel with each other at the common terminal 650 as seen from the common terminal 650, and a Smith chart (right side) for explaining movement of the complex impedance that occurs when the inductance element 71 is connected in parallel with the common terminal 650.

As illustrated on the left side of FIG. 9, the complex impedance in the pass bands of the circuit in which four filters are connected in parallel with each other at the common terminal 650 exhibits a high capacitive property (outer periphery of lower semicircle of Smith chart). Furthermore, as the number of filters to be supported increases due to the accelerating development of multimode and multiband technologies, the capacitive property of the complex impedance of the circuit becomes stronger.

Here, in order to match the complex impedance to the characteristic impedance in the pass bands, it is necessary to adjust the inductance value of the parallel-connected inductance element 71 so as to become smaller as illustrated on the right side of FIG. 9. In other words, as the number of filters increases, it is necessary to parallel connect an inductance element 71 having a smaller inductance value. In this comparative example, the inductance value of the inductance element 71 was about 1.5 nH, for example.

However, when such an inductance element 71 having a small inductance value is parallel connected, the impedance of the inductance element 71 becomes smaller and it becomes easier for a current to flow towards the reference (ground) terminals. Thus, a high-frequency signal, which it is desired to let pass, leaks to the reference (ground) terminals, and the insertion loss in the pass bands of the filters increases.

Figure 10A:
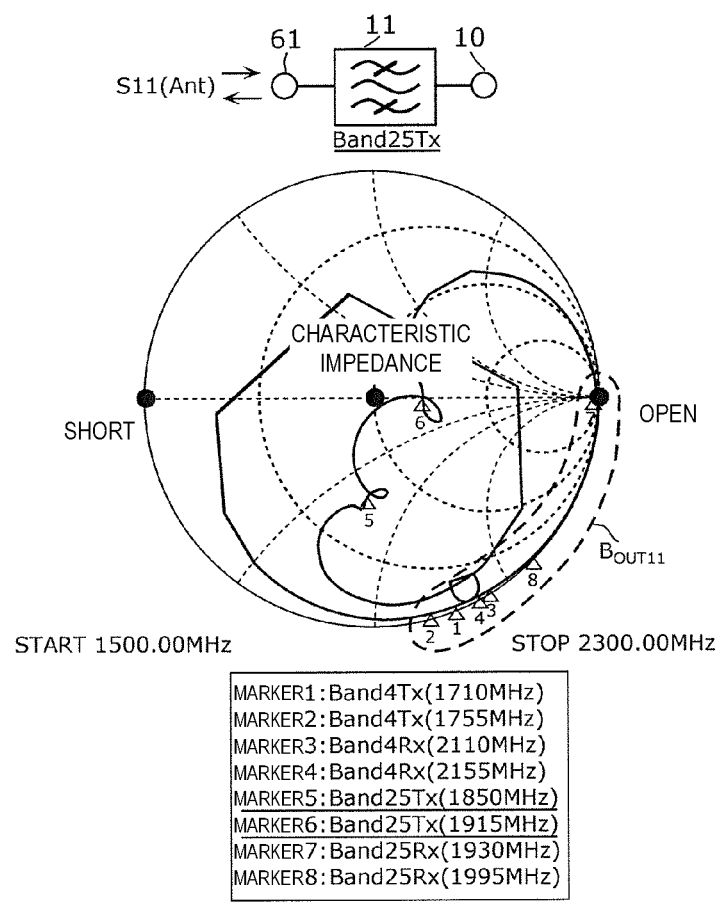
FIG. 10A depicts a Smith chart that illustrates the complex impedance of the Band 25 transmission filter according to the example in a standalone state as seen from a transmission output terminal.
Figure 10B:
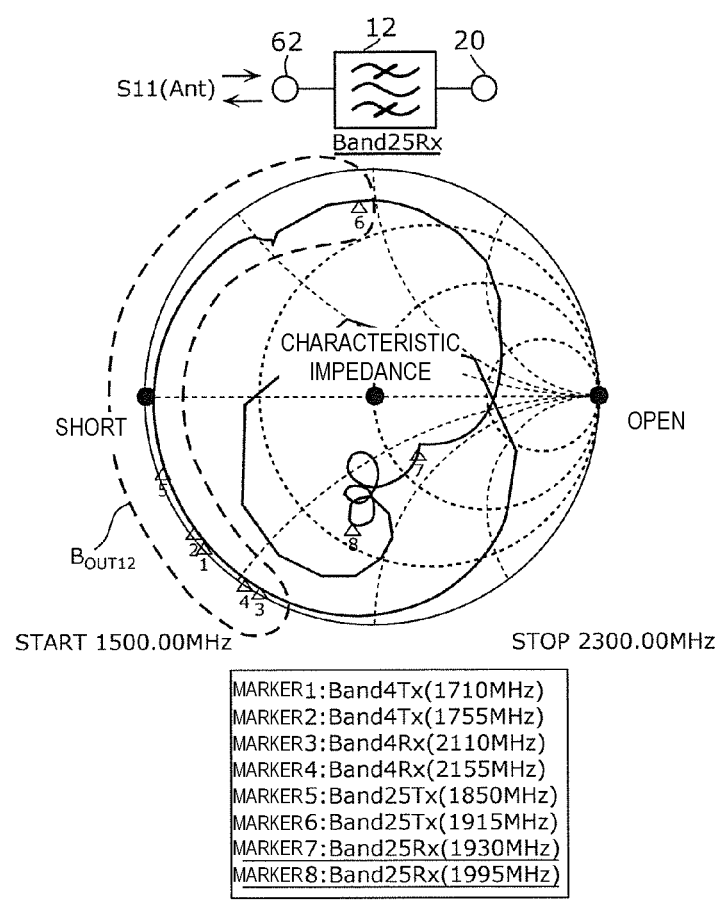
FIG. 10B depicts a Smith chart that illustrates the complex impedance of the Band 25 reception filter according to the example in a standalone state as seen from a reception input terminal.
Figure 10C:
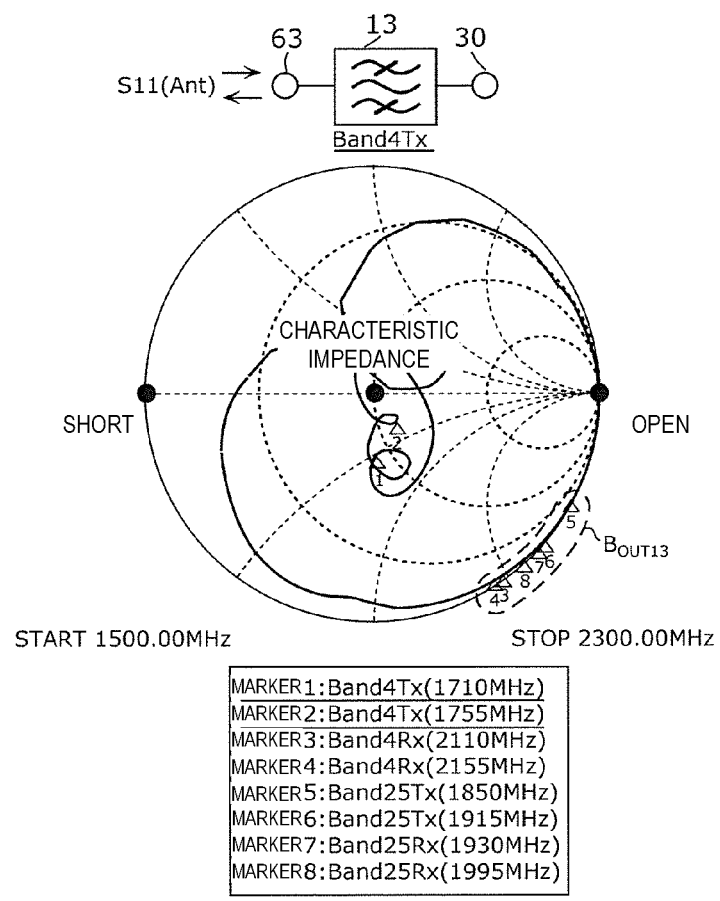
FIG. 10C depicts a Smith chart that illustrates the complex impedance of the Band 4 transmission filter according to the example in a standalone state as seen a transmission output terminal.

FIGS. 10A and 10B respectively depict a Smith chart that illustrates the complex impedance of the Band 25 transmission filter 11 according to the example of a preferred embodiment of the present invention in a standalone state as seen from the transmission output terminal 61, and a Smith chart that illustrates the complex impedance of the Band 25 reception filter 12 according to the example in a standalone state as seen from the reception input terminal 62. Furthermore, FIGS. 10C and 10D respectively depict a Smith chart that illustrates the complex impedance of the Band 4 transmission filter 13 according to the example in a standalone state as seen from the transmission output terminal 63, and a Smith chart that illustrates the complex impedance of the Band 4 reception filter 14 according to the example in a standalone state as seen from the reception input terminal 64.

Figure 10D:
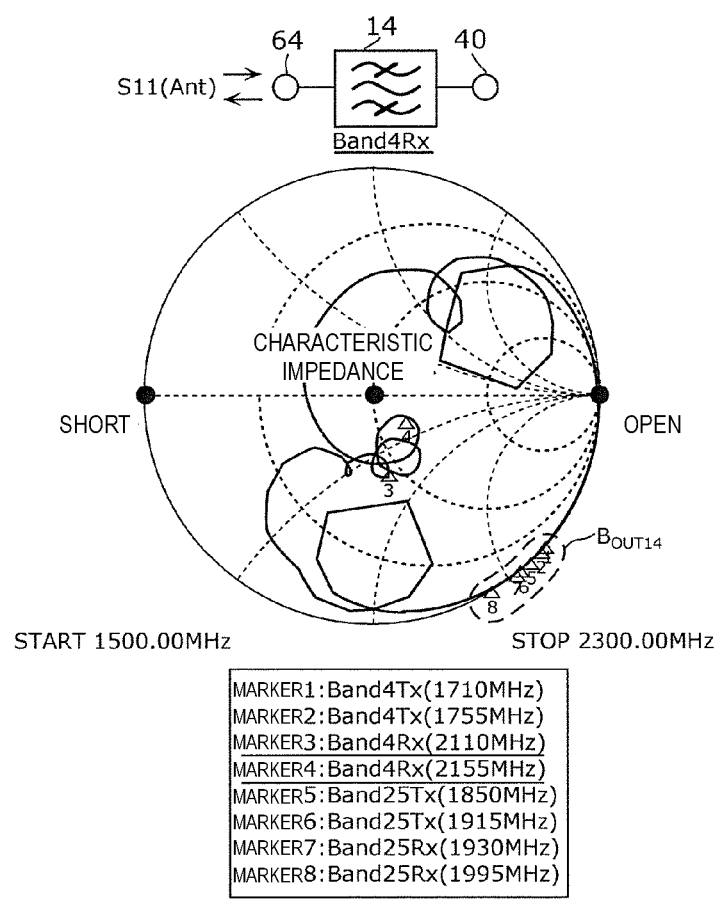
FIG. 10D depicts a Smith chart that illustrates the complex impedance of the Band 4 reception filter according to the example in a standalone state as seen from a reception input terminal.

As in the comparative example, the multiplexer 1 according to the present example is designed such that the complex impedances in the frequency regions outside the pass bands are moved towards the open side in the impedance characteristics of the transmission filters 11 and 13 and the reception filter 14 in standalone states. Specifically, the complex impedance of an outside-of-passband region $B_{OUT11}$ of the transmission filter 11, which does not include the inductance element 21 connected thereto, in FIG. 10A, the complex impedance of an outside-of-passband region $B_{OUT13}$ of the transmission filter 13, which does not include the second inductor 21 connected thereto, in FIG. 10C, and the complex impedance of an outside-of-passband region $B_{OUT14}$ of the reception filter 14, which does not include the inductance element 21 connected thereto, in FIG. 10D are all substantially arranged on the open side. In order to achieve these arrangements of complex impedances, the resonators, which are connected to the common terminal 50, of the three filters are series resonators rather than parallel resonators.

On the other hand, in the reception filter 12, which includes the second inductor 21 connected thereto, a parallel resonator is used as the resonator that is connected to the common terminal 50. Therefore, as illustrated in FIG. 10B, the complex impedance of an outside-of-passband region $B_{OUT12}$ of the reception filter 14 is arranged substantially on the short side. The purpose of arranging the outside-of-passband region $B_{OUT12}$ on the short side is described hereafter.

Figure 11:
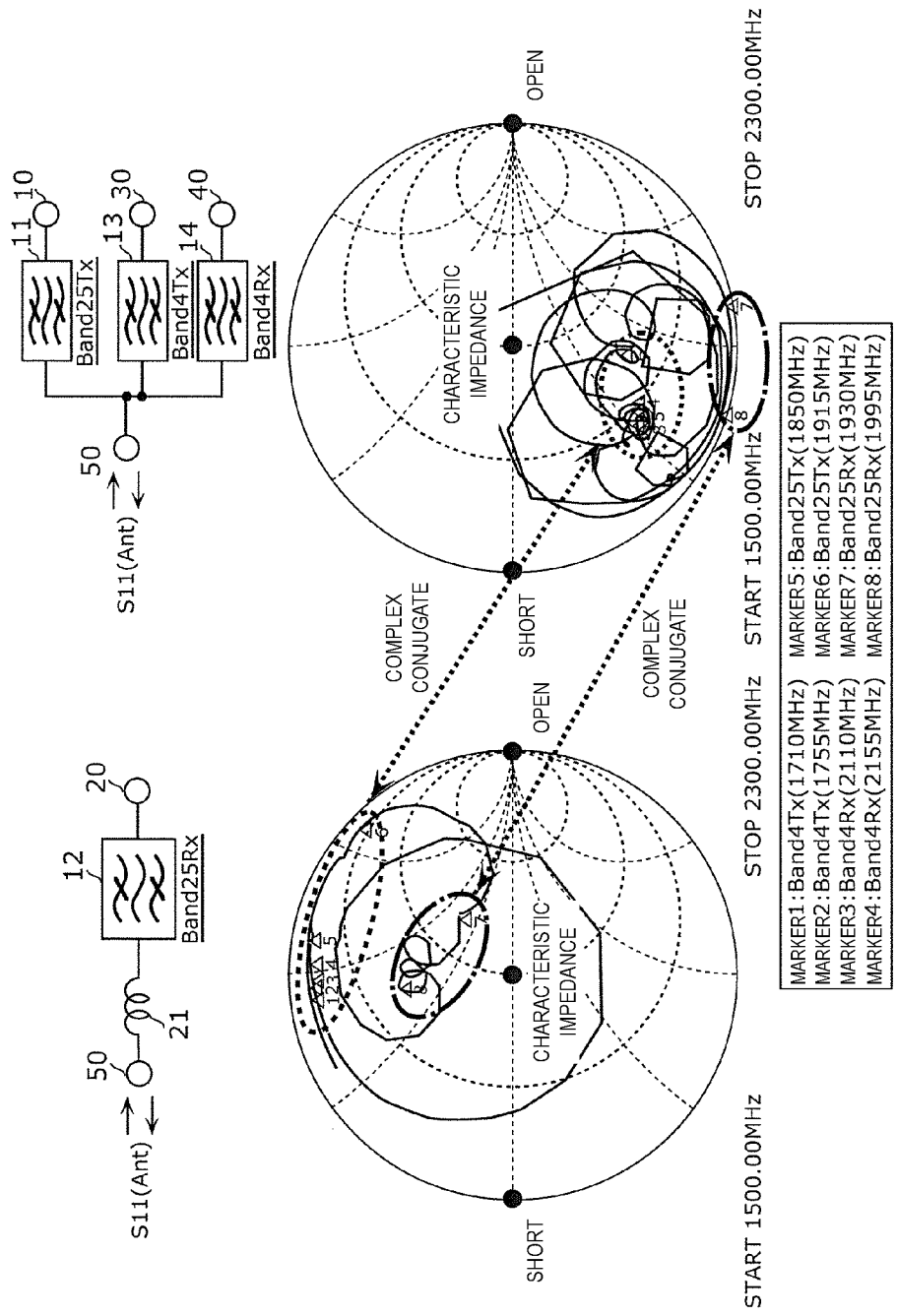
FIG. 11 depicts a Smith chart that illustrates the complex impedance of a circuit in a standalone state in which the Band 25 reception filter according to the example and an inductance element are connected in series with each other as seen from the inductance element, and a Smith chart that illustrates the complex impedance of a circuit in a standalone state in which all the filters other than the Band 25 reception filter according to the example are connected in parallel with each other at a common terminal as seen from the common terminal.

FIG. 11 depicts a Smith chart (left side) that illustrates the complex impedance of a circuit in a standalone state in which the Band 25 reception filter 12 according to the example and the inductance element 21 are connected in series with each other as seen from the common terminal 50, and a Smith chart that illustrates the complex impedance of a circuit in a standalone state in which all of the filters other than the Band 25 reception filter 12 according to the example are connected in parallel with each other at the common terminal 50 as seen from the common terminal 50.

As illustrated in FIG. 11, it is clear that the complex impedance in a prescribed pass band in the case in which the reception filter 12 is viewed in a standalone state via the inductance element 21 in a state where the inductance element 21 and the input terminal of the reception filter 12 are connected in series with each other and the complex impedance in the prescribed pass band in the case in which the transmission filters 11 and 13 and the reception filter 14 are viewed from the side of the terminal connected to the common terminal 50 in a state where the terminals among the input terminals and output terminals of the transmission filters 11 and 13 and the reception filter 14 that are closer to the antenna element 2 are connected to the common terminal 50 are in a relationship that is close to a complex conjugate relationship. In other words, if these two complex impedances are combined with each other, impedance matching is achieved and the complex impedance of the composite circuit moves close to the characteristic impedance. The meaning of "the complex impedances of two circuits are in a complex conjugate relationship" includes a relationship in which the signs of the complex components of the complex impedances are inverted and is not limited to the case in which the absolute values of the complex components are equal or substantially equal to each other. In other words, the meaning of "a complex conjugate relationship" in this preferred embodiment also includes a relationship in which the complex impedance of one circuit is located in the capacitive region (lower semicircle of Smith chart) and the complex impedance of the other circuit is located in the inductive region (upper semicircle of Smith chart).

Here, as illustrated in FIG. 10B, the purpose of arranging the complex impedance of the outside-of-passband region $B_{OUT12}$ of the reception filter 12 substantially on the short side is to cause the complex impedance of the outside-of-passband region $B_{OUT12}$ (pass band of transmission filters 11 and 13 and reception filter 14) to be shifted to a position at which the complex impedance has the above-described complex conjugate relationship by using an inductance element 21 having a smaller inductance value. The inductance value of the inductance element 21 at this time is preferably about 5.9 nH, for example. In the case in which the outside-of-passband region $B_{OUT12}$ of the reception filter 12 is positioned on the open side as in the comparative example, the outside-of-passband region $B_{OUT12}$ needs to be shifted to a position at which the complex impedance has the above-described complex conjugate relationship by using an inductance element 21 having a larger inductance value. Since the inductance element 21 is serially connected, the insertion loss inside the pass band of the reception filter 12 is degraded to a greater extent, the larger the inductance value of the inductance element 21 becomes. In other words, since it is possible to make the inductance value of the inductance element 21 smaller by using the parallel resonator 251 to cause the complex impedance of the outside-of-passband region $B_{OUT12}$ to be arranged on the short side as in the case of the reception filter 12 according to the example, insertion loss inside the pass band is able to be reduced.

Figure 12A:
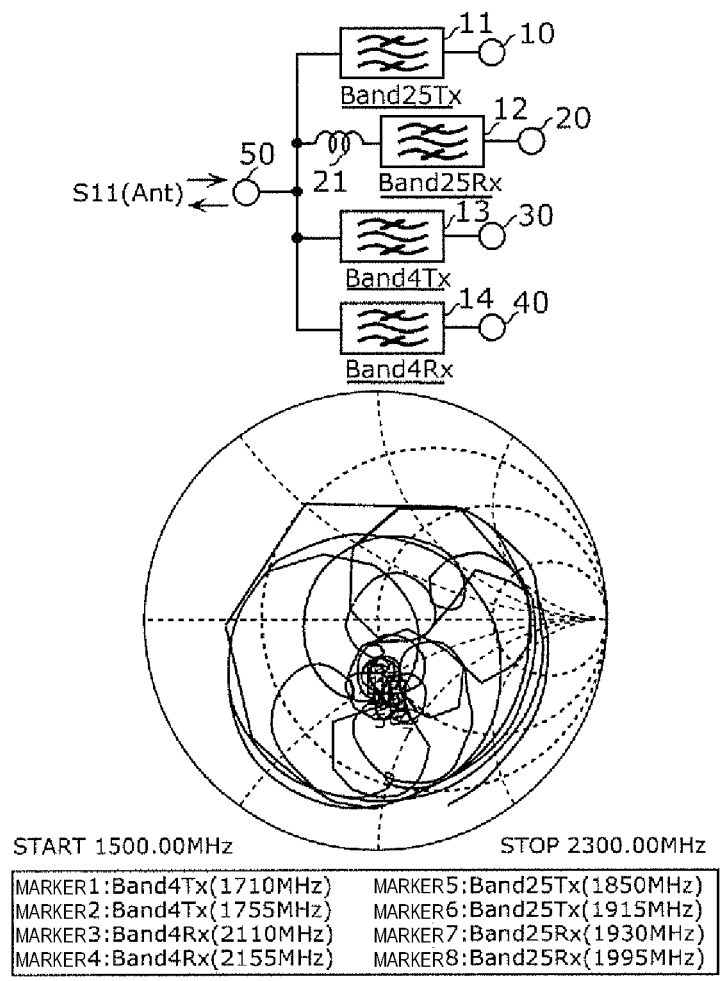
FIG. 12A depicts a Smith chart that illustrates a complex impedance seen when the multiplexer according to the example is viewed from a common terminal.

FIG. 12A depicts a Smith chart that illustrates a complex impedance when the multiplexer 1 according to the example of a preferred embodiment of the present invention is viewed from the common terminal 50. That is, the complex impedance illustrated in FIG. 12A represents the complex impedance of a multiplexer defined by combining the two circuits illustrated in FIG. 11 as viewed from the common terminal 50. The complex impedance of the composite circuit is brought close to the characteristic impedance in the four pass bands and impedance matching is achieved by causing the complex impedances of the two circuits illustrated in FIG. 11 to be arranged in a complex conjugate relationship with respect to each other.

Figure 12B:
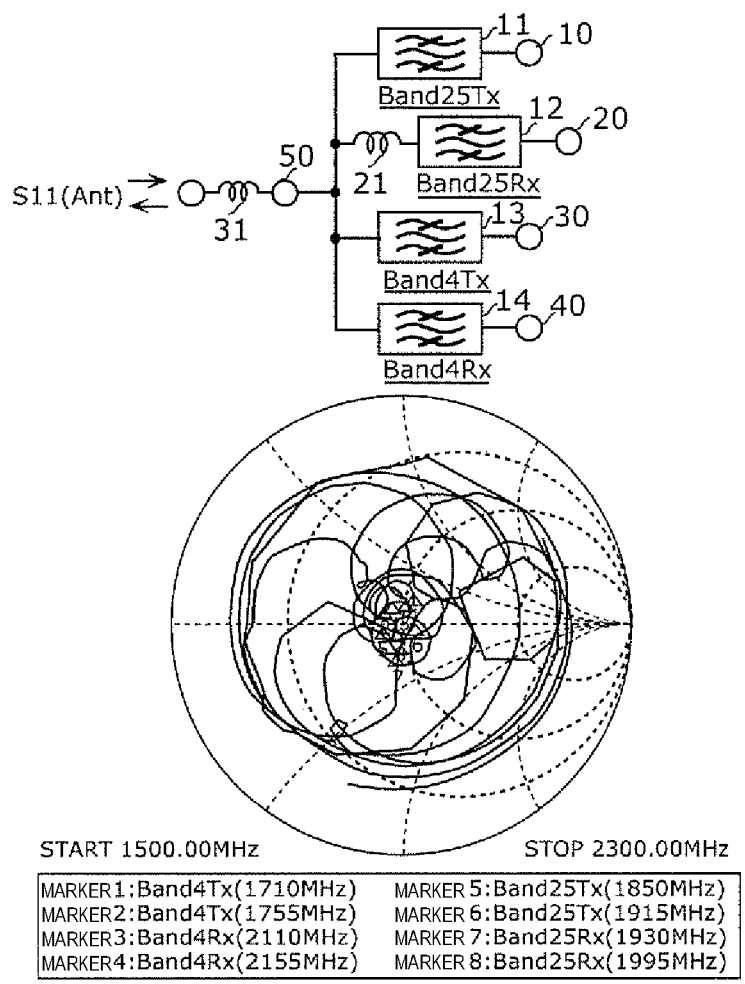
FIG. 12B depicts a Smith chart that illustrates a complex impedance seen from an antenna element in the case where an inductance element is connected in series between a common terminal of a multiplexer according to the example and an antenna element.

FIG. 12B depicts a Smith chart that illustrates the complex impedance seen from the antenna element 2 in the case in which the inductance element 31 is connected in series between the common terminal 50 of multiplexer 1 according to the example and the antenna element 2. As illustrated in FIG. 12A, in the circuit defined by combining the two circuits that are arranged in a complex conjugate relationship with each other, the complex impedance is spaced apart from the characteristic impedance, although only slightly, (slightly spaced apart toward the capacitive side). In contrast, the complex impedance of the multiplexer 1 as seen from the common terminal 50 is finely adjusted towards the inductive side by serially connecting the inductance element 31 between the common terminal 50 and the antenna element 2. The inductance value of the inductance element 31 at this time is preferably about 2.3 nH, for example. Thus, the complex impedance in the pass band of each filter of the multiplexer 1 is able to be made to match the characteristic impedance without degrading the insertion loss of each filter.

As described above, the configuration of the multiplexer 1 according to the example differs from that of the multiplexer 600 according to the comparative example in that (1) the inductance element 21 is serially connected between the reception filter 12 and the common terminal 50, (2) the inductance element 31, which is located between the common terminal 50 and the antenna element 2, is serially connected rather than parallel connected, and (3) the parallel resonator 251 is connected to the reception input terminal 62 of the reception filter 12.

With this configuration, the complex impedance of a circuit in a standalone state in which the inductance element 21 having a small inductance value and the reception filter 12 are connected in series with each other as seen from the common terminal 50 and the complex impedance of a circuit in a standalone state in which all of the filters except for the reception filter 12 are connected in parallel with each other at the common terminal 50 as seen from the common terminal 50 are able to have a complex conjugate relationship with respect to each other. As a result, the complex impedance of the multiplexer 1 that includes the circuit defined by combining the above-described two circuits as seen from the common terminal 50 are able to match the characteristic impedance while securing low loss inside the pass bands. Furthermore, the complex impedance of the multiplexer 1 as seen from the common terminal 50 is able to be finely adjusted towards the inductive side by serially connecting the inductance element 31 having a small inductance value between the common terminal 50 and the antenna element 2.

Next, a high-frequency front end circuit 70 that includes the multiplexer 1 according to the above-described example of a preferred embodiment of the present invention, and a communication device 80 will be described.

Figure 13:
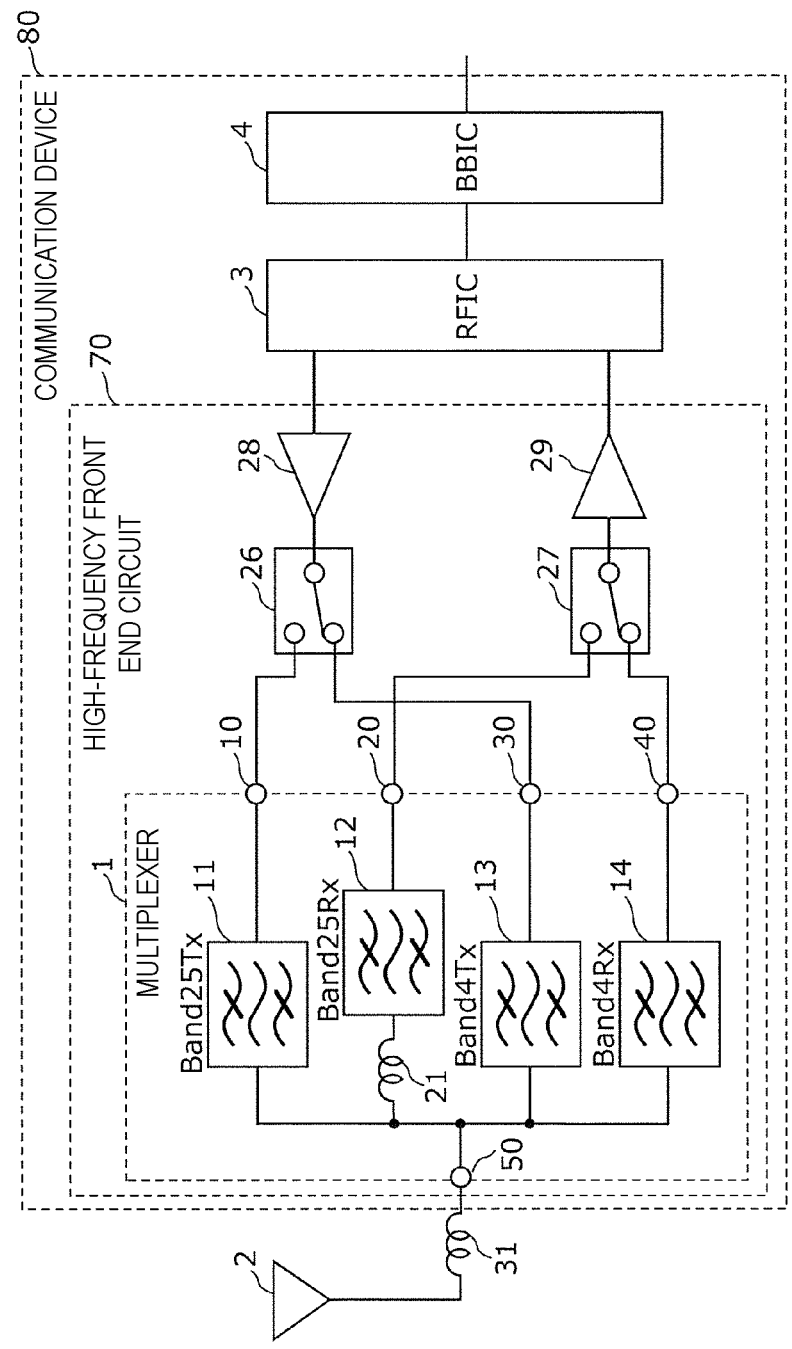
FIG. 13 is a circuit configuration diagram of a high-frequency front end circuit that includes the multiplexer according to the example, and a communication device.

FIG. 13 is a circuit configuration diagram of the high-frequency front end circuit 70 that includes the multiplexer 1 according to the example, and the communication device 80. In FIG. 13, the high-frequency front end circuit 70, the antenna element 2, an RF signal processing circuit (RFIC) 3, a baseband signal processing circuit (BBIC) 4, and the inductance element 31 are illustrated. The high-frequency front end circuit 70 and the RF signal processing circuit 3 and the baseband signal processing circuit 4 define the communication device 80.

The high-frequency front end circuit 70 includes the multiplexer 1 according to the example, a transmission switch 26, a reception switch 27, a power amplifier circuit 28 and a low-noise amplifier circuit 29.

The transmission switch 26 is a switch circuit including two selection terminals that are individually connected to the transmission input terminals 10 and 30 of the multiplexer 1, and a common terminal that is connected to the power amplifier circuit 28.

The reception switch 27 is a switch circuit that includes two selection terminals that are individually connected to the reception output terminals 20 and 40 of the multiplexer 1, and a common terminal that is connected to the low-noise amplifier circuit 29.

The transmission switch 26 and the reception switch 27 each connect the common terminal thereof and a signal path that handles a prescribed band in accordance with a control signal from a control unit (not illustrated), and are preferably single pole double throw (SPDT) switches, for example. The configuration of the switches is not limited to one in which one selection terminal is connected to the common terminal and a plurality of selection terminals may instead be connected to the common terminal. In other words, the high-frequency front end circuit 70 may support carrier aggregation.

The power amplifier circuit 28 is a transmission amplification circuit that amplifies a high-frequency signal (here, high-frequency transmission signal) output from the RF signal processing circuit 3, and outputs the amplified high-frequency signal to the antenna element 2 via the transmission switch 26 and the multiplexer 1.

The low-noise amplifier circuit 29 is a reception amplification circuit that amplifies a high-frequency signal (here, high-frequency reception signal) supplied thereto via the antenna element 2, the multiplexer 1 and the reception switch 27 and outputs the amplified high-frequency signal to the RF signal processing circuit 3.

The RF signal processing circuit 3 subjects a high-frequency reception signal input thereto via a reception signal path from the antenna element 2 to signal processing using down conversion and other suitable techniques, and outputs a reception signal generated through the signal processing to the baseband signal processing circuit 4. In addition, the RF signal processing circuit 3 subjects a transmission signal input from the baseband signal processing circuit 4 to signal processing using up conversion and other suitable techniques, and outputs a high-frequency signal generated through the signal processing to the power amplification circuit 28. The RF signal processing circuit 3 is preferably an RFIC, for example.

A signal generated through the processing performed by the baseband signal processing circuit 4 is used as an image signal in an image display, or is used as an audio signal in a telephone call, for example.

The high-frequency front end circuit 70 may include other circuit elements between the above-described elements.

With the high-frequency front end circuit 70 and communication device 80, even though the number of supported bands and modes is increased, the insertion loss inside the pass bands of the filters that define the signal paths of the bands are reduced by providing the multiplexer 1 according to the example.

Furthermore, depending on the method used to process the high-frequency signals, the communication device 80 does not need to include the baseband signal processing circuit 4.

A multiplexer according to a preferred embodiment of the present invention has been described using the example of a quadplexer above. However, preferred embodiments of the present invention are not limited to this example. For example, preferred embodiments obtained by modifying the example in the following ways may be included in the present invention.

For example, a 50° Y-cut X-propagation $LiTaO_3$ single crystal material is preferably used as the piezoelectric layer 53 of the substrate 5 according to the example, but the cut angle of the single crystal material is not limited to this cut angle. In other words, the cut angle of the piezoelectric layer of surface acoustic wave filters of the multiplexer according to the example in which a $LiTaO_3$ single crystal is preferably used as a piezoelectric layer is not limited to a 50° Y-cut angle. In the case of a surface acoustic wave filter in which a $LiTaO_3$ piezoelectric layer having a cut angle other than that described above is used, a similar effect is produced. In addition, the piezoelectric layer may be made of another type of piezoelectric single crystal, such as $LiNbO_3$, for example. In addition, in the present invention, as long as the substrate 5 includes the piezoelectric layer 53, a structure may be used for the substrate in which the piezoelectric layer is stacked on a support substrate rather than the entire substrate 5 being made of the piezoelectric layer.

In addition, the multiplexer 1 according to a preferred embodiment of the present invention may preferably further include the inductance element 31 that is serially connected between the antenna element 2 and the common terminal 50. For example, the multiplexer 1 according to a preferred embodiment of the present invention may have a configuration in which a plurality of elastic wave filters having the above-described characteristics, and the inductance elements 21 and 31, which are in the form of chips, are mounted on a high-frequency substrate.

Furthermore, the inductance elements 21 and 31, for example, may be chip inductors, or may be defined by conductor patterns provided in or on the high-frequency substrate.

In addition, the multiplexers according to preferred embodiments of the present invention are not limited to being a Band 25+Band 4 quadplexer as in the example.

Figure 14A:
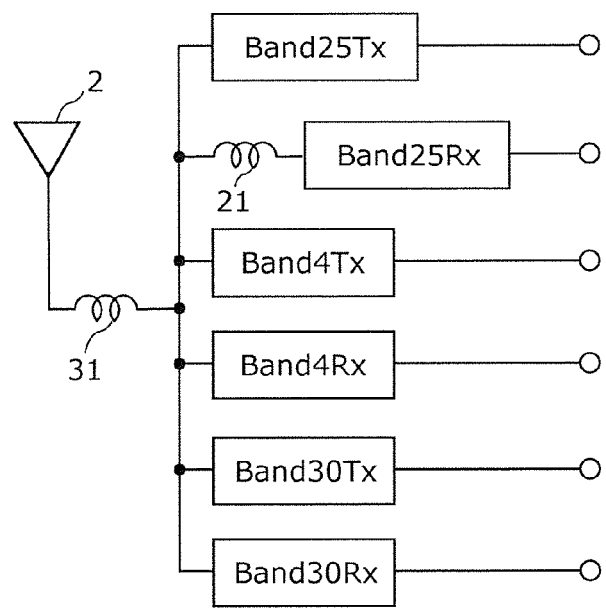
FIG. 14A illustrates the configuration of a multiplexer according to a modification 1 of a preferred embodiment of the present invention.

FIG. 14A illustrates the configuration of a multiplexer according to modification 1 of a preferred embodiment of the present invention. For example, as illustrated in FIG. 14A, the multiplexer according to modification 1 may be a hexaplexer including six frequency bands that is used in a system configuration that uses Band 25, Band 4 and Band 30, which include transmission and reception bands, in combination with each other. In this case, for example, the inductance element 21 is connected in series with the Band 25 reception filter, and a parallel resonator is connected to the reception input terminal of the Band 25 reception filter. In addition, series resonators, rather than parallel resonators, are connected to the terminals of the five filters, other than the Band 25 reception filter, that are connected to the common terminal.

Figure 14B:
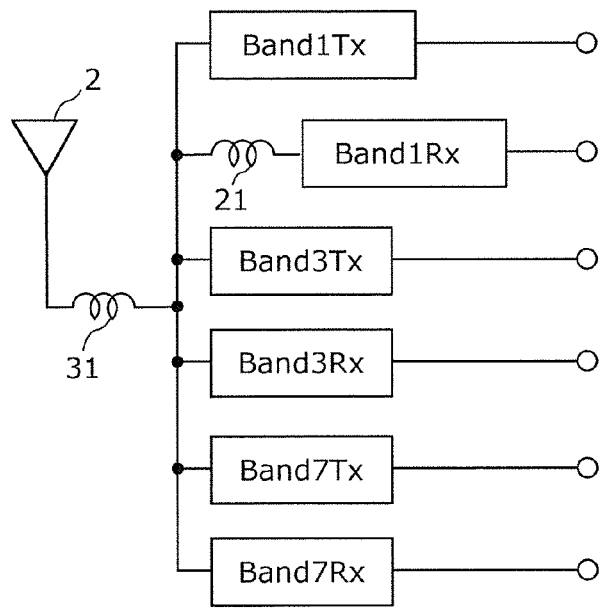
FIG. 14B illustrates the configuration of a multiplexer according to a modification 2 of a preferred embodiment of the present invention.

FIG. 14B illustrates the configuration of a multiplexer according to modification 2 of a preferred embodiment of the present invention. For example, as illustrated in FIG. 14B, the multiplexer according to modification 2 may be a hexaplexer including six frequency bands that is used in a system configuration that uses Band 1, Band 3 and Band 7, which include transmission and reception bands, in combination with each other. In this case, for example, the inductance element 21 is connected in series with the Band 1 reception filter, and a parallel resonator is connected to the reception input terminal of the Band 1 reception filter. In addition, series resonators, rather than parallel resonators, are connected to the terminals of the five filters, other than the Band 1 reception filter, that are connected to the common terminal.

As described above, in contrast to the multiplexer configured using a matching method of the related art, in the multiplexers according to preferred embodiments of the present invention, insertion loss inside the pass bands is reduced as the number of elastic wave filters, which are elements of the multiplexer, increases.

Furthermore, the multiplexers according to preferred embodiments of the present invention do not need to have a configuration that includes a plurality of duplexers that perform transmission and reception. For example, preferred embodiments of the present invention may be applied as a transmission device including a plurality of transmission frequency bands. That is, the multiplexers according to preferred embodiments of the present invention may be applied as a transmission device that is input with a plurality of high-frequency signals having different carrier frequency bands, subjects the plurality of high-frequency signals to filtering and then wirelessly transmits the filtered high-frequency signals from a common antenna, and that includes a plurality of transmission elastic wave filters that are input with a plurality of high-frequency signals from a transmission circuit and that allow only prescribed frequency bands to pass therethrough, and a common terminal to which a first inductance element is serially connected in a connection path between the common terminal and an antenna element. Here, the plurality of transmission elastic wave filters each include at least one of a series resonator that includes an IDT electrode provided on a piezoelectric layer and is connected between an input terminal and an output terminal of the elastic wave filter, and a parallel resonator that includes an IDT electrode provided on a piezoelectric layer and that is connected between an electrical path that connects the input terminal and the output terminal, and a reference terminal. In addition, among the plurality of transmission elastic wave filters, the output terminal of one transmission elastic wave filter is connected to the common terminal via a second inductance element, which is connected to the output terminal and the common terminal, and is connected to a parallel resonator. On the other hand, the output terminals of the transmission elastic wave filters other than the one transmission elastic wave filter are connected to the common terminal and are each connected to the series resonator among the series resonator and the parallel resonator.

Furthermore, the multiplexers according to preferred embodiments of the present invention may be applied as a reception device including a plurality of reception frequency bands, for example. That is, the multiplexers according to preferred embodiments of the present invention may be applied to a reception device that is input with a plurality of high-frequency signals having different carrier frequency bands via an antenna element, demultiplexes the plurality of high-frequency signals and then outputs the plurality of high-frequency signals to a reception circuit, and that includes a plurality of reception elastic wave filters that are input with a plurality of high-frequency signals from the antenna element and allow only prescribed frequency bands to pass therethrough, and a common terminal to which a first inductance element is serially connected in a connection path between the antenna element and the common terminal. Here, the plurality of reception elastic wave filters each include at least one of a series resonator that includes an IDT electrode provided on a piezoelectric layer and is connected between an input terminal and an output terminal of the elastic wave filter, and a parallel resonator that includes an IDT electrode provided on a piezoelectric layer and that is connected between an electrical path, which connects the input terminal and the output terminal, and a reference terminal. In addition, among the plurality of reception elastic wave filters, the input terminal of one reception elastic wave filter is connected to the common terminal via a second inductance element, which is connected to the input terminal and the common terminal, and is connected to a parallel resonator. On the other hand, the input terminals of the reception elastic wave filters other than the one reception elastic wave filter are connected to the common terminal and are each connected to the series resonator among the series resonator and the parallel resonator.

In the case of the transmission device or the reception device described above, the same or similar effects as with the multiplexer 1 according to the example of a preferred embodiment are produced.

In addition, preferred embodiments of the present invention are able to be implemented not only as a multiplexer, which includes elastic wave filters and inductance elements, a transmission device, and a reception device as described above, but also as an impedance matching method for a multiplexer in which the characteristic elements are produced as steps of the method.

Figure 15:
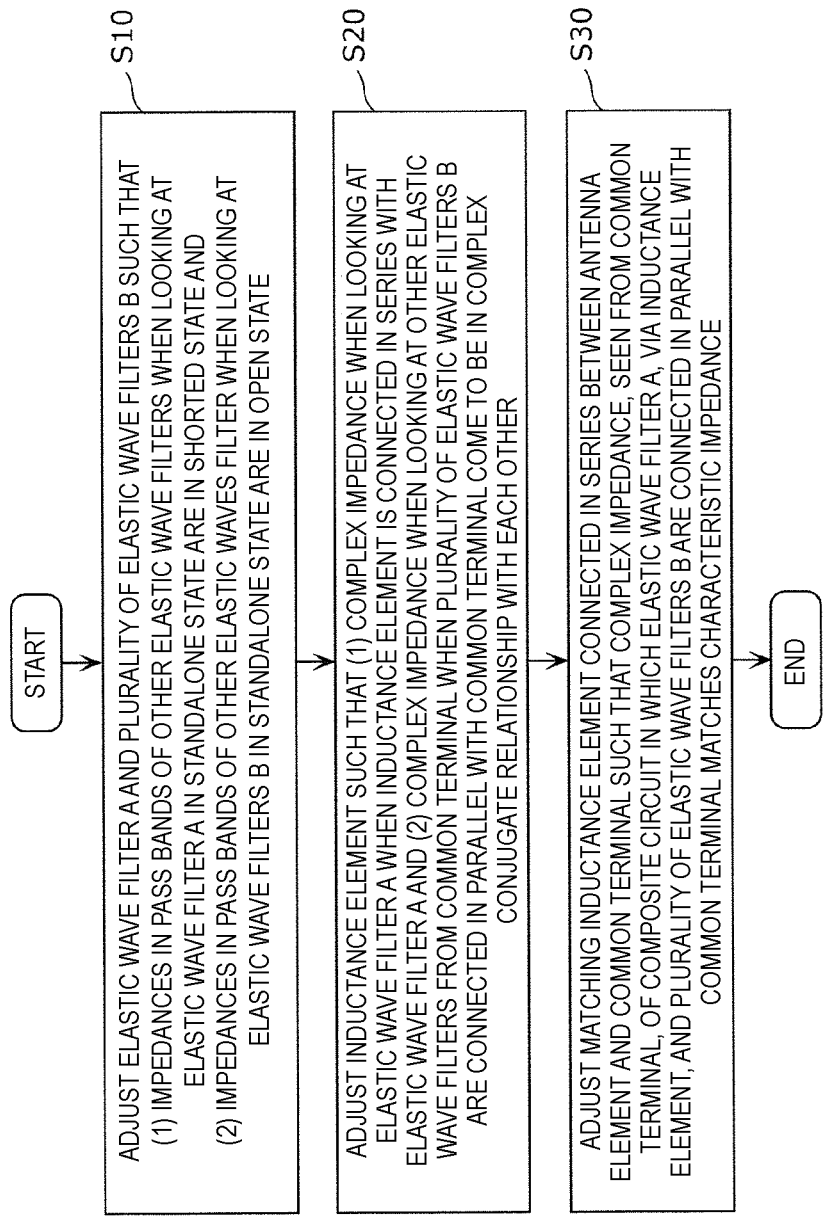
FIG. 15 is an operation flowchart for explaining an impedance matching method for a multiplexer according to a preferred embodiment of the present invention.

FIG. 15 is an operation flowchart for explaining a non-limiting example of an impedance matching method for a multiplexer according to a preferred embodiment of the present invention.

An impedance matching method for a multiplexer according to a preferred embodiment of the present invention includes a step (S10) of (1) adjusting a plurality of elastic wave filters having different pass bands from each other such that the complex impedances in the pass bands of other elastic wave filters when looking at one elastic wave filter (elastic wave filter A) in a standalone state from an input terminal or an output terminal of the one elastic wave filter from among the plurality of elastic wave filters are in shorted state, and such that the complex impedances in the pass bands of the other elastic wave filters (elastic wave filters B) when looking at the elastic wave filters other than the one elastic wave filter in a standalone state from the input terminals or output terminals of the elastic wave filters are in an open state; a step (S20) of (2) adjusting the inductance value of a filter-matching-use inductance element such that the complex impedance when looking at the one elastic wave filter (elastic wave filter A) from the filter-matching-use inductance element when the filter-matching-use inductance element is connected in series with the one elastic wave filter, and the complex impedance when looking at the elastic wave filters other than the one elastic wave filter (plurality of elastic wave filters B) from the common terminal when the other elastic wave filters are connected in parallel with the common terminal are in a complex conjugate relationship with each other; and a step (S30) of (3) adjusting the inductance value of an antenna-matching-use inductance element that is serially connected between an antenna element and the common terminal such that the complex impedance, seen from the common terminal, of a composite circuit in which the one elastic wave filter (elastic wave filter A) is connected to the common terminal via the filter-matching-use inductance element and the other elastic wave filters (plurality of elastic wave filter B) are connected in parallel with the common terminal matches a characteristic impedance; and in which (4), in the step of adjusting the plurality of elastic wave filters, among the plurality of elastic wave filters each including at least one of a series resonator that includes an IDT electrode provided on a piezoelectric layer and is connected between an input terminal and an output terminal of the elastic wave filter and a parallel resonator that includes an IDT electrode provided on a piezoelectric layer and is connected between an electrical path, which connects the input terminal and the output terminal of the elastic wave filter, and a reference terminal, the parallel resonator and the series resonator are arranged such that the parallel resonator is connected to the filter-matching-use inductance element in the one elastic wave filter and the series resonator among the parallel resonator and the series resonator is connected to the common terminal in each of the other elastic wave filters.

Thus, a multiplexer is provided that has low loss even though the number of bands and modes supported by the multiplexer is increased.

Furthermore, surface acoustic wave filters including IDT electrodes have been exemplified as transmission filters and reception filters that define a multiplexer, a quadplexer, a transmission device, a reception device, a high-frequency front end circuit and a communication device in the above-described preferred embodiments. However, the filters that define the multiplexer, the quadplexer, the transmission device, the reception device, the high-frequency front end circuit and the communication device according to preferred embodiments of the present invention may be elastic wave filters that include series resonators and parallel resonators and utilize boundary acoustic waves or bulk acoustic waves (BAW). In this case, an effect is produced that is the same or similar as the effect produced by the multiplexer, the quadplexer, the transmission device, the reception device, the high-frequency front end circuit, and the communication device according to the above-described preferred embodiments.

In addition, although a configuration in which the inductance element 21 is connected in series with the reception filter 12 is exemplified in the multiplexer 1 according to the example of a preferred embodiment of the present invention described above, a configuration in which the inductor element 21 is connected in series with a transmission filter is also included in preferred embodiments of the present invention. In other words, a multiplexer according to a preferred embodiment of the present invention may have a configuration that includes a plurality of elastic wave filters having different pass bands from each other; a common terminal to which a first inductance element is serially connected in a connection path between an antenna element 2 and the common terminal; and a second inductance element; and in which an output terminal of a transmission filter, among the plurality of elastic wave filters, is connected to the common terminal via the second inductance element, which is connected to the output terminal and the common terminal, and is connected to a parallel resonator, and terminals on the antenna side among input terminals and output terminals of the elastic wave filters other than the transmission filter are connected to the common terminal and are each connected to the series resonator. With this configuration, a multiplexer is provided that has low loss even through the number of bands and modes supported by the multiplexer is increased.

Preferred embodiments of the present invention may be widely used in communication devices, such as cellular phones, as low-loss multiplexers, transmission devices, and reception devices that may be applied to frequency standards that support multiple bands and multiple modes.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A multiplexer that transmits and receives a plurality of high-frequency signals via an antenna element, the multiplexer comprising:
   a plurality of elastic wave filters that have different pass bands from each other;
   a common terminal to which a first inductance element is serially connected in a connection path between the antenna element and the common terminal; and
   a second inductance element; wherein
   each of the plurality of elastic wave filters includes at least one series resonator that is connected between an input terminal and an output terminal of the respective elastic wave filter and at least one parallel resonator that is connected between a connection path, which connects the input terminal and the output terminal, and a reference terminal;
   an antenna-element-side terminal among the input terminal and the output terminal of one elastic wave filter among the plurality of elastic wave filters is connected to the common terminal via the second inductance element, which is connected to the antenna-element-side terminal and the common terminal, and is connected to the at least one parallel resonator; and
   antenna-element-side terminals among the input terminals and the output terminals of the plurality of elastic wave filters other than the one elastic wave filter are connected to the common terminal, and are each connected to the at least one series resonator.

2. The multiplexer according to claim 1, wherein the plurality of elastic wave filters include:
   a first elastic wave filter that has a first pass band, and that outputs a transmission signal to the antenna element;
   a second elastic wave filter that has a second pass band that is different from the first pass band, and that is input with a reception signal from the antenna element;
   a third elastic wave filter that has a third pass band that is at a lower frequency than the first pass band and the second pass band, and that outputs a transmission signal to the antenna element; and
   a fourth elastic wave filter that has a fourth pass band that is at a higher frequency than the first pass band and the second pass band, and that is input with a reception signal from the antenna element; and
   the one elastic wave filter, to which the second inductance element is connected, is at least one of the second elastic wave filter and the fourth elastic wave filter.

3. The multiplexer according to claim 1, wherein one of the plurality of elastic wave filters is a Band 25 transmission filter.

4. The multiplexer according to claim 1, wherein one of the plurality of elastic wave filters is a Band 25 reception filter.

5. The multiplexer according to claim 1, wherein one of the plurality of elastic wave filters is a Band 4 transmission filter.

6. The multiplexer according to claim 1, wherein one of the plurality of elastic wave filters is a Band 4 reception filter.

7. The multiplexer according to claim 1, wherein the one elastic wave filter, to which the second inductance element is connected, is a reception filter that filters a reception wave in Band 25.

8. A high-frequency circuit comprising:
   the multiplexer according to claim 1.

9. A communication device comprising:
   the multiplexer according to claim 1.

10. A device that transmits and receives a plurality of high-frequency signals via an antenna element, the device comprising:
    a plurality of elastic wave filters that have different pass bands from each other;
    a common terminal to which a first inductance element is serially connected in a connection path between the antenna element and the common terminal; and
    a second inductance element; wherein
    each of the plurality of elastic wave filters includes at least one series resonator that is connected between an input terminal and an output terminal of the respective elastic wave filter and at least one parallel resonator that is connected between a connection path, which connects the input terminal and the output terminal, and a reference terminal;
    an antenna-element-side terminal among the input terminal and the output terminal of one elastic wave filter among the plurality of elastic wave filters is connected to the common terminal via the second inductance element, which is connected to the antenna-element-side terminal and the common terminal, and is connected to the at least one parallel resonator; and
    antenna-element-side terminals among the input terminals and the output terminals of the plurality of elastic wave filters other than the one elastic wave filter are connected to the common terminal, and are each connected to the at least one series resonator.

11. The device according to claim 10, wherein one of the plurality of elastic wave filters is a Band 25 transmission filter.

12. The device according to claim 10, wherein one of the plurality of elastic wave filters is a Band 25 reception filter.

13. The device according to claim 10, wherein one of the plurality of elastic wave filters is a Band 4 transmission filter.

14. The device according to claim 10, wherein one of the plurality of elastic wave filters is a Band 4 reception filter.

15. The device according to claim 10, wherein the one elastic wave filter, to which the second inductance element is connected, is a reception filter that filters a reception wave in Band 25.

* * * * *